United States Patent [19]

Hayano

[11] Patent Number: 5,408,139
[45] Date of Patent: Apr. 18, 1995

[54] SEMICONDUCTOR INTEGRATED CIRCUIT DEVICE HAVING CIRCUIT FOR GENERATING POWER-ON RESET SIGNAL

[75] Inventor: Kouji Hayano, Hyogo, Japan

[73] Assignee: Mitsubishi Denki Kabushiki Kaisha, Tokyo, Japan

[21] Appl. No.: 145,851

[22] Filed: Nov. 5, 1993

[30] Foreign Application Priority Data

Nov. 9, 1992 [JP] Japan .................. 4-298349

[51] Int. Cl.⁶ .................. H03K 5/153; H03K 3/01
[52] U.S. Cl. .................. 327/143; 327/198; 327/545
[58] Field of Search ............. 307/272.3, 296.4, 296.5, 307/296.1

[56] References Cited

U.S. PATENT DOCUMENTS

| | | | |
|---|---|---|---|
| 3,764,884 | 10/1973 | Reeve .................. | 307/265 |
| 3,788,454 | 11/1988 | Tanagawa et al. ........... | 307/443 |
| 5,177,375 | 1/1993 | Ogawa et al. ............. | 307/296.5 |
| 5,309,037 | 5/1994 | Curley et al. ............. | 307/296.4 |

Primary Examiner—Timothy P. Callahan
Assistant Examiner—Terry L. Englund
Attorney, Agent, or Firm—Lowe, Price, LeBlanc & Becker

[57] ABSTRACT

A semiconductor integrated circuit device includes an internal circuit and a power-on reset signal generation circuit. The internal circuit includes an output node and an input for a power-on reset signal. The potential of the output node becomes indefinite immediately after the power-up. The internal circuit also has a function of forcing the potential of the output node to a high level in response to the power-on reset signal being applied for a sufficiently long period of time. The power-on reset signal generation circuit has a reset input, an input connected to the output node, and an output connected to the input for the power-on reset signal in the internal circuit. The power-on reset signal generation circuit starts generating the power-on reset signal in response to input of a reset signal, and stops the generation of the power-on reset signal in response to the potential of the output node attaining the high level. Since the generation of the power-on reset signal is not stopped until the potential of the first output node attains the first level, the internal circuit can surely reset the potential of the output node to the high level.

16 Claims, 17 Drawing Sheets

SEMICONDUCTOR INTEGRATED CIRCUIT DEVICE HAVING CIRCUIT FOR GENERATING POWER-ON RESET SIGNAL

BACKGROUND OF THE INVENTION

1. Field of the Invention

The present invention relates generally to semiconductor integrated circuit devices, and more specifically, to a semiconductor integrated circuit device including a signal generation circuit for outputting a power-on reset signal.

2. Description of the Background Art

FIG. 1 is a block diagram showing a conventional semiconductor integrated circuit device including a power-on reset signal generation circuit. Referring to FIG. 1, the conventional semiconductor integrated circuit device 120 includes a power supply potential node 100 supplied with power supply potential Vcc, and a ground potential node 110 connected to the ground potential. Semiconductor integrated circuit 120 further includes a power-on reset signal generation circuit 121 receiving the power supply potential from power supply potential node 100, and outputting a power-on reset signal POR which rises to a prescribed potential in response to a rising of the power supply potential from the ground potential to a prescribed potential (5 V, for example) and falls to a low level (L level) after lapse of a prescribed time period.

Semiconductor integrated circuit device 120 further includes an internal circuit 123 driven by power supply potential Vcc supplied from power supply potential node 100 to process an input signal. Internal circuit 123 includes a processing circuit 123a. Processing circuit 123a has an output node 105, and the potential of the output attains an unstable state, if a signal input to processing circuit 123a is not active when the power supply potential rises from the ground potential.

Referring to FIG. 2, power-on reset signal generation circuit 121 includes a capacitor 121a connected between power supply potential node 100 and a first node 121b, a discharge transistor 121c formed of an n channel MOS (Metal Oxide Semiconductor) transistor connected between first node 121b and ground potential node 110, first and second inverters 121d and 121f connected between first node 121b and a $\overline{POR}$ output node 121e in an inverse-parallel manner and each driven by power supply potential Vcc from power supply potential node 100.

First inverter 121d and second inverter 121f use their own outputs as each other's inputs to constitute a flipflop circuit. The flipflop circuit has two stable states. In one stable state, the flipflop circuit holds an H level (high level) potential higher than a prescribed threshold voltage at first node 121b, and an L level (low level) potential substantially the same as the ground potential and lower than a prescribed threshold voltage at $\overline{POR}$ output node 121e. In the other steady state, the flipflop circuit holds the L level potential at first node 121b and the H level potential at $\overline{POR}$ output node 121e.

Power-on reset signal output circuit 121 further includes a third inverter 121g driven by power supply potential Vcc supplied from power supply potential node 100, and having an input connected to $\overline{POR}$ output node 121e and an output connected to POR output node 122, and a delay circuit 121h receiving a power-on reset signal POR from POR output node 122 and outputting a delay signal DPOR delayed from the power-on reset signal by a prescribed time period to the gate of discharge transistor 121c. Delay circuit 121h is for example a general delay circuit formed of a capacitor and a resistor.

One example of processing circuit 123a is illustrated in FIG. 3. Referring to FIG. 3, processing circuit 123a includes two NOR gates 123a1 and 123a2 constituting a flipflop circuit. NOR gate 123a1 has three inputs connected to an input node 123a3, POR output node 122, and the output of NOR gate 123a2, respectively. NOR gate 123a2 has two inputs connected to an input node 123a4 and the output of NOR gate 123a1, respectively. The potentials of output nodes 123a5 and 123a6 of NOR gates 123a1 and 123a2, respectively, attain an unstable state when the power supply potential rises from the ground potential.

In the flipflop circuit formed of NOR gates 123a1 and 123a2, the outputs on output nodes 123a5 and 123a6 are indefinite, when inputs from input nodes 123a3, 123a4, and POR output node 122 are all at the L level potential. More specifically, in this case, these outputs can take either the L level potential or the H level potential.

If an input from POR output node 122 is the H level potential, however, the potential of output node 123a5 attains the L level regardless of the value of input from either of input node 123a3 and 123a4. When an input to input node 123a4 is the L level potential as when power supply potential Vcc rises from the ground potential, the output of output node 123a6 becomes the H level potential.

Referring to a timing chart in FIG. 4, the conventional semiconductor integrated circuit device 120 shown in FIGS. 1 to 3 operates as follows at the time of power-up. As illustrated in FIG. 4(a), assume that power supply potential Vcc starts rising from the ground potential toward a prescribed potential at time $t_1$. At this time, the input of input node 123a4 is the L level potential.

Referring to FIG. 4(b), the potential N1 of first node 121b rises following power supply potential Vcc through capacitor 121a. It is assumed that the potential N1 of first node 121b, as illustrated in FIG. 4(b), exceeds the threshold voltage of first inverter 121d at time $t_2$. As illustrated in FIG. 4(c), until time $t_2$, power supply potential Vcc is output as power-on reset inversion signal $\overline{POR}$ to $\overline{POR}$ output node 121e. At time $t_2$, the potential N1 of first node 121b exceeds the threshold voltage of first inverter 121d. At time $t_2$, power-on reset inversion signal $\overline{POR}$ output to $\overline{POR}$ output node 121e is substantially pulled to the ground potential. Note that power-on reset inversion signal $\overline{POR}$ is at a potential slightly higher than the ground potential near time $t_2$, but does not exceed the threshold voltage of third inverter 121g at the time.

In response to power-on reset inversion signal $\overline{POR}$, third inverter 121g outputs power-on reset signal POR to its POR output node 122. Power-on reset signal POR, as illustrated in FIG. 4(e), follows power supply potential Vcc and rises to the high level potential.

In response to power-on reset signal POR, the potential of an output node whose potential is indefinite when power supply potential Vcc rises is reset as follows. Note that, in this case, the potential IN1 of output node 123a5 is reset to the L level, and the potential IN2 of output node 123a6 is reset to the H level Vcc. The potential IN1 of output node 123a5 is, as illustrated in FIG. 4(f), reset to the L level at time $t_3$. The potential IN2 of output node 123a6 is reset to the H level at time $t_4$ as illustrated in FIG. 4(g).

Meanwhile, power-on reset signal POR is delayed by delay circuit 121h (see FIG. 2) by a prescribed time delay ΔT and applied to the gate of discharge transistor 121c as a delay signal DPOR. Delay signal DPOR rises delayed from power-on reset signal POR by ΔT as illustrated in FIG. 4(d), and exceeds the threshold voltage of discharge transistor 121c at time $t_5$. It is noted that time $t_5$ is later than time $t_2$ by a period ΔT.

Discharge transistor 121c conducts, and first node 121b and ground potential 110 are electrically connected. The potential N1 of first node 121b begins to fall to the L level potential as illustrated in FIG. 4(b) after time $t_5$. Potential N1 reaches to the L level potential at time $t_6$.

In response to the potential N1 of first node 121b falling to the L level potential, power-on reset inversion signal $\overline{POR}$ output to POR output node 121e rises. As illustrated in FIG. 4(c), power-on reset inversion signal $\overline{POR}$ exceeds the threshold voltage of third inverter 121g at time $t_6$.

Power-on reset signal POR output to POR output node 122 from third inverter 121g falls substantially to the ground potential at time $t_7$ as illustrated in FIG. 4(e). Delay signal DPOR output by delay circuit 121h falls substantially to the ground potential at time $t_8$ as illustrated in FIG. 4(d). Discharge transistor 121c is turned off, and first node 121b is electrically isolated from ground potential node 110.

Upon usual turning on of the power supply, power-on reset signal generation circuit 121 applies power-on reset signal POR to processing circuit 123a as described above. In response to power-on reset signal POR, the internal state of processing circuit 123a and its output are reset. Power-on reset signal generation circuit 121 is also reset after a prescribed time period in response to delay signal DPOR delayed from power-on reset signal POR, and power-on reset signal POR output therefrom falls to the L level potential.

Assume that during a usual operation of semiconductor integrated circuit device 120 power supply potential Vcc instantaneously fails. In such a case, power supply potential Vcc becomes an L level potential during a period of about 100 ns–1 μs from a prescribed potential and then once again rises. The operation of the conventional power-on reset signal generation circuit 121 and semiconductor integrated circuit device 120 in this case will be described.

Referring to FIG. 5(a), power supply potential Vcc which is usually H level potential falls to L level potential at time $t_{10}$.

Referring to FIGS. 2 and 5(b), the falling of power supply potential is transmitted to first node 121b through capacitor 121a, and the potential N1 of first node 121b falls from a substantial ground potential (L level) to a minus level.

Since the potential N1 of first node 121b is equal to or smaller than the L level, power-on reset inversion signal $\overline{POR}$ output from first inverter 121d follows power supply potential Vcc as illustrated in FIG. 5(c) and falls from H level to L level potential at time $t_{11}$.

Referring to FIG. 2, second inverter 121f tends to maintain the potential N1 of first node 121b at the ground potential until the potential of power-on reset inversion signal $\overline{POR}$ is equal to or smaller than the threshold voltage of inverter 121f. The potential N1 of first node 121b is however more affected by the negative potential provided from capacitor 121a. Accordingly, the potential N1 of first node 121b falls to about the potential of the inverse of a prescribed potential for usual power supply potential Vcc.

As illustrated in FIG. 5(a), at time $t_{12}$ after the passage of time period 100 ns–1 μm from time t10, power supply potential Vcc rises, and then potential N1 of first node 121b rises as illustrated in FIG. 5(b) affected by the rising of power supply potential Vcc through capacitor 121a. The potential N1 of first node 121b rises to a level slightly higher than a substantial ground potential (L level).

Referring to FIG. 5(c), power-on reset inversion signal $\overline{POR}$ output from first inverter 121d follows power supply potential Vcc and starts rising from L level potential to H level potential, since the potential N1 of first node 121b on the input side is still at the L level. At time $t_{13}$, the potential of power-on reset inversion signal $\overline{POR}$ exceeds the threshold voltage of third inverter 121g.

Until time $t_{13}$, as illustrated in FIG. 5(e), power-on reset signal POR output by third inverter 121b rises with the rising of power supply potential Vcc and attains the H level. When power-on reset inversion signal $\overline{POR}$ exceeds the threshold voltage of third inverter 121g at time $t_{13}$, power-on reset signal POR falls to L level potential, and then to a substantial ground potential at time $t_{14}$.

Signal DPOR delayed from power-on reset signal POR output from delay circuit 121h also rises to the H level potential at time $t_{15}$ delayed from power-on reset signal POR by a time delay ΔT as illustrated in FIG. 5(d), and then falls to L level potential.

Power-on reset signal POR output from the above-described conventional power-on reset generation circuit 121 is sometimes at the H level potential only during a short period of time, if power supply potential Vcc instantaneously fails. In such a case, power-on reset signal POR can fall before a resetting processing is surely performed in response to power-on reset signal POR in internal circuit 123 shown in FIG. 1. Uncertain resetting of the output node of processing circuit 123a results in subsequent erroneous operation in the processing circuit. Such a disadvantage needs to be overcome.

SUMMARY OF THE INVENTION

It is therefore an object of the invention to provide a semiconductor integrated circuit device capable of correctly maintaining operation in an internal circuit even at the time of instantaneous power failure.

Another object of the invention is to provide a semiconductor integrated circuit device capable of surely resetting an output node even at the time of instantaneous power failure.

Yet another object of the invention is to provide a semiconductor integrated circuit device capable of generating a power-on reset signal over a period of time sufficient for surely resetting an output node even at the time of instantaneous power failure and of resetting the output node with the power-on reset signal.

An additional object of the invention is to provide a semiconductor integrated circuit device capable of outputting a power-on reset signal until resetting of an output node is detected at the time of instantaneous power failure.

A still further object of the invention is to provide a semiconductor integrated circuit device capable of outputting a power-on reset signal until resetting of a plurality of output nodes is detected at the time of instantaneous power failure.

A still additional object of the invention is to provide a semiconductor integrated circuit device capable of surely resetting a plurality of output nodes to corresponding potentials at the time of instantaneous power failure.

A semiconductor integrated circuit device according to the invention includes an internal circuit, and a power-on reset signal generation circuit. The internal circuit is connected between a first potential and a second potential, and has a first output node and an input for a power-on reset signal. The potential of the first output node becomes indefinite immediately after the potential difference between the first potential and the second potential becomes equal to or larger than a predetermined value. The internal circuit has a function of forcing the potential of the first output node to a predetermined first level in response to the power-on reset signal being applied longer than a prescribed time period. The power-on reset signal generation circuit includes a first input to which a first signal is input, a second input connected to the first output, and an output connected to the power-on reset signal input of the internal circuit. The power-on reset signal generation circuit starts generating the power-on reset signal in response to input of the first signal, and stops the power-on reset signal in response to the potential of the first output node attaining the first level. The first signal may be externally applied through a terminal of the semiconductor integrated circuit device or internally generated by detecting the power supply potential attaining a level equal to or higher than a prescribed level.

Since the power-on reset signal is not stopped unless the potential of the first output node attains the first level, the internal circuit can surely force the first output node to be set to the first potential.

In another aspect of the invention, the internal circuit has a plurality of first output nodes. The power-on reset signal generation circuit includes a detection circuit, and a reset signal input storage circuit. The detection circuit detects the plurality of first output nodes all attaining the first level and generates a detection signal. The reset signal input storage circuit stores a prescribed first value in response to the initiation of input of the first signal, stores a prescribed second value different from the first value in response to the detection signal, and outputs a power-on reset signal by changing the potential of the output of the power-on reset signal generation circuit according to the stored values.

Since the generation of the power-on reset signal is not stopped until the first output nodes all attain the first level, the plurality of output nodes can surely be reset. Subsequent operations in the internal circuit can therefore be normally maintained.

In another aspect of the invention, the internal circuit has, in addition to the first output node, a second output node whose potential becomes indefinite immediately after the potential difference between the first potential and second potential becomes equal to or higher than a prescribed value. The internal circuit further has a function of forcing the potential of the second output node to a second level different from the first level in response to the power-on reset signal being applied in a longer time period than a prescribed time period. The power-on reset signal generation circuit includes a detection circuit and a reset signal input storage circuit.

The detection circuit detects the potential of the first output node attaining the first level and the potential of the second output node attaining the second level, and generates a detection signal. The reset signal input storage circuit stores a prescribed first value in response to the initiation of input of the first signal, stores a prescribed second value different from the first value in response to the detection signal, and outputs a power-on reset signal by changing the potential of the output of the power-on reset signal generation circuit according to the stored values.

Since the generation of the power-on reset signal is not stopped unless the first output node attains the first level and the second output node attains the second level, the plurality of output nodes can surely be reset to corresponding reset potentials. Subsequent operation of the internal circuit is normally maintained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Now, a semiconductor integrated circuit device according to a first embodiment of the invention will be described.

Figure 6:
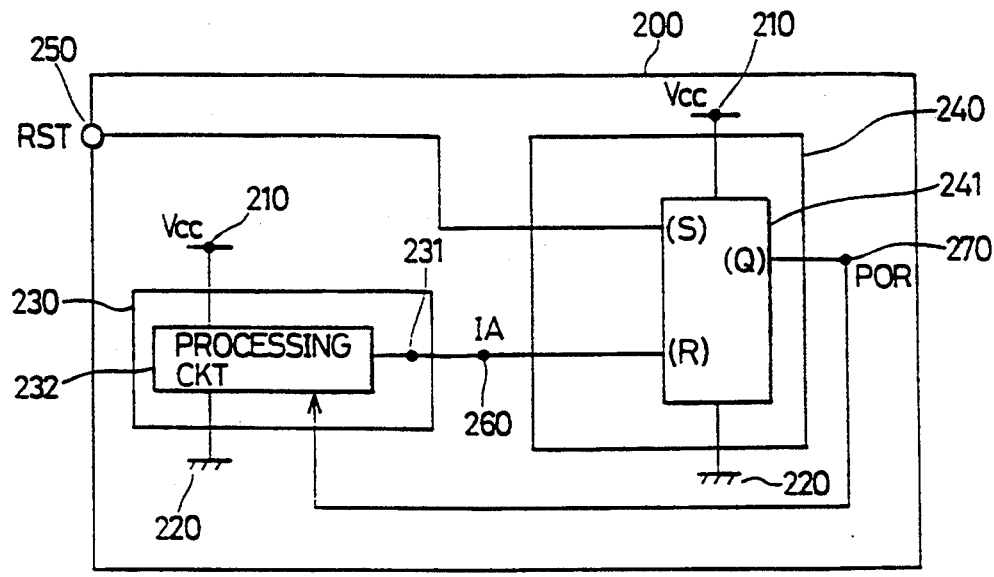
FIG. 6 is a circuit diagram showing a power-on reset signal generation circuit according to a first embodiment of the invention.

Referring to FIG. 6, semiconductor integrated circuit device 200 according to the first embodiment of the invention has a power supply potential node 210 supplied with power supply potential Vcc, and a ground potential node 220 connected to the ground potential. Semiconductor integrated circuit device 200 further includes an internal circuit 230 powered by power supply potential Vcc at power supply potential node 210 for performing a prescribed processing, and a power-on reset signal generation circuit 240 powered by power supply potential Vcc supplied from power supply potential node 210 for providing a power-on reset signal POR to internal circuit 230.

Internal circuit 230 includes a processing circuit 232 connected to power supply potential node 210 and ground potential node 220 and having an output node 231 whose potential attains an indefinite state during a rising of power supply potential Vcc. The output of output node 231 attains an indefinite state, when the potential Vcc of power supply potential node 210 rises from the ground potential to a prescribed potential (5 V in this embodiment), and the other input signals to processing circuit 232 are in an inactive state. In the indefinite state, it cannot be determined if the potential of output node 231 become an H level potential higher than a prescribed threshold voltage or an L level potential lower than the threshold voltage.

Note that ground potential is included in L level potentials, and a prescribed potential for power supply potential Vcc is included in H level potentials.

Power-on reset signal generation circuit 240 includes an R-S flipflop circuit 241 connected to power supply potential node 210 and ground potential node 220 and powered by power supply potential Vcc at power supply potential node 210 to operate.

The set input (S) of R-S flipflop 241 is connected to a reset signal input terminal 250. The reset input (R) of R-S flipflop circuit 241 is connected to the output node 231 of processing circuit 232 through an input node 260. The set preferential output (Q) of R-S flipflop circuit 241 is connected to a POR output node 270 which is in turn connected to processing circuit 232. The set input of R-S flipflop circuit 241 is connected to an external reset signal input terminal 250 but may be connected to a reset signal output terminal of another circuit inside the chip. In the case of the embodiment shown in FIG. 6, it should be noted that the output node 231 of processing circuit 232 is reset to the H level potential at the time of resetting.

R-S flipflop circuit 241 has the following function. R-S flipflop circuit 241 outputs a signal of H level regardless of the potential of its reset input (R), if its set input (S) is at H level. If the set input (S) is at L level and the potential of reset input (R) is at H level, R-S flipflop circuit 241 outputs a signal of L level. If set input (S) is at L level potential and the potential of reset input (R) is at L level, R-S flipflop circuit 241 continues to output the level which it has been outputting until then.

Accordingly, power-on reset signal generation circuit 240 responds to reset signal RST applied externally or from a circuit inside the chip at a terminal 50, and the potential IA of output node 231 of internal circuit 232, and outputs power-on reset signal POR. Power-on reset signal POR rises from L level to H level as reset signal RST rises from L level potential to H level potential, and falls when the potential IA of second input node 260 becomes a reset potential. Note that in the embodiment shown in FIG. 6, the reset potential of output node 231 is selected to be at H level potential.

Figure 10:
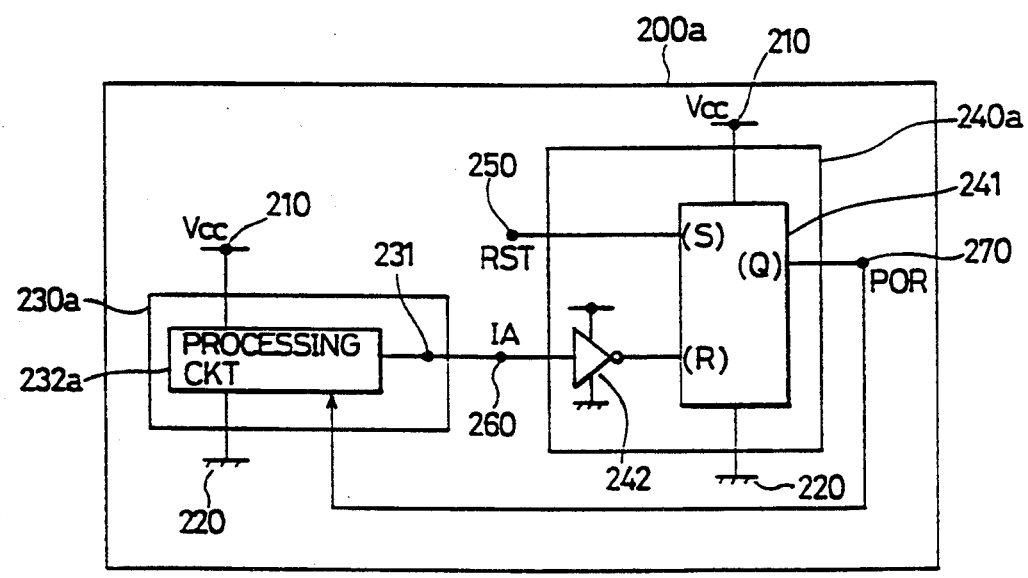
FIG. 10 is a circuit diagram showing a power-on reset signal generation circuit according to a variation of the first embodiment of the invention.

If the reset potential of output node 231 of processing circuit 232 is selected to be at L level, power-on reset signal generation circuit 240a shown in FIG. 10 is used instead of the circuit shown in FIG. 6. FIG. 10 will be described later.

Figure 7A:
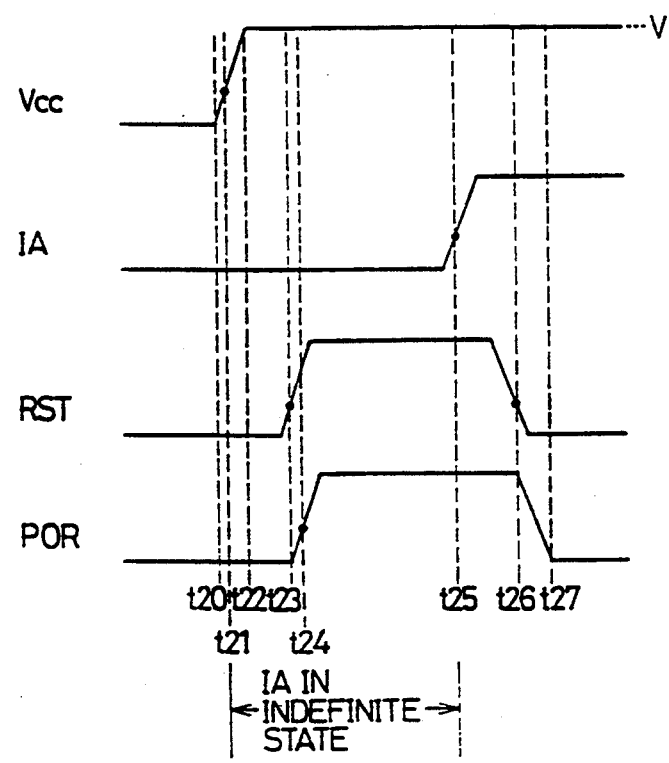
FIGS. 7A to 9 are timing charts for use in illustration of the operation of the first embodiment of the invention.

Referring to FIG. 7A, semiconductor integrated circuit device 200 according to the first embodiment operates as follows when reset signal RST is activated or is at H level over a prolonged period of time. Referring to FIG. 7A, potential Vcc at power supply potential node 210 starts rising from the ground potential at time $t_{20}$, attains the H level exceeding a prescribed threshold voltage at time $t_{21}$, and reaches prescribed potential V at time $t_{22}$.

The potential IA of output node 231 of processing circuit 232 attains an indefinite state as power supply potential Vcc rises. The operation of power-on reset signal generation circuit 240 will be described for the case in which potential IA attains the L level in response to the power-up.

Referring to FIG. 7A at (b), although power supply potential Vcc rises, potential IA in this case is maintained at L level.

Referring to FIG. 7A at (c), reset signal RST applied to terminal 250 rises from L level potential to H level potential at time $t_{24}$. In response to reset signal RST attaining the H level, the output of R-S flipflop circuit 241 shown in FIG. 6 rises to the H level potential regardless of the level of potential IA.

More specifically, referring to FIG. 7A at (d), power-on reset signal POR output from R-S flipflop circuit 241 rises from L level potential to H level potential at time $t_{24}$ slightly after time $t_{23}$.

In response to power-on reset signal POR attaining the H level, the potential IA of output node 231 of processing circuit 232, as illustrated in FIG. 7A at (b), rises to the reset potential, in other words to the high level potential at time $t_{25}$.

Thereafter, referring to FIG. 7A at (c), reset signal RST applied to terminal 250 falls from H level potential to L level potential at time $t_{26}$.

Referring to FIGS. 6 and 7A at (b) and (c), after time $t_{26}$, the set input (S) of R-S flipflop circuit 241 is at L level potential, and reset input (R) is at H level potential. As described above, R-S flipflop circuit 241 outputs the L level potential to output (Q) under this condition. Accordingly, as illustrated in FIG. 7A at (d), power-on reset signal POR falls to the substantially ground potential at time $t_{27}$.

Figure 7B:
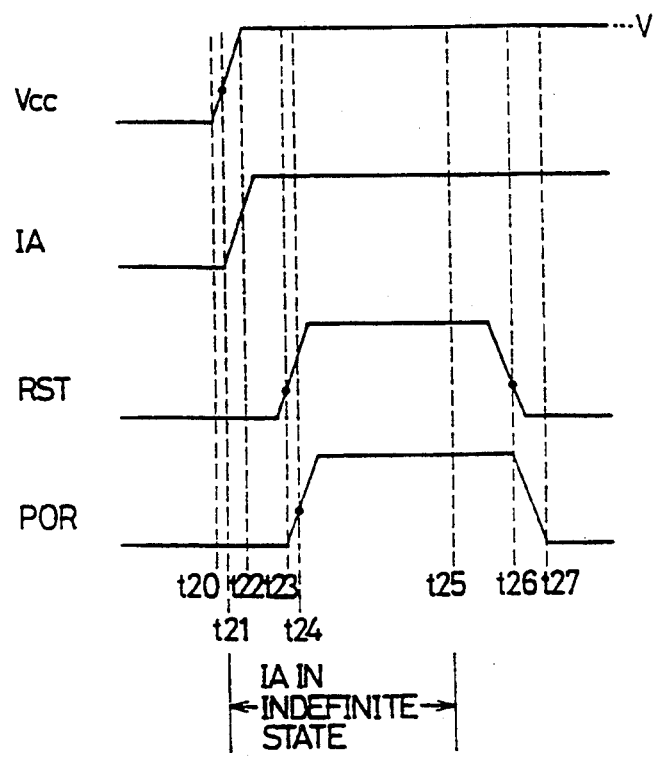

The semiconductor integrated circuit device 200 operates as follows when potential IA attains the H level at the time of the power-up. Referring to FIG. 7B at (a), power supply potential Vcc starts rising at time $t_{20}$, rises from L level to H level at time $t_{21}$, and reaches the prescribed potential V at time $t_{22}$.

Referring to FIGS. 6 and 7B at (b), the potential IA of output node 231 of processing circuit 232 starts rising from time $t_{21}$ at the time of power-up and attains the H level.

Referring to FIG. 7B at (c), assume that reset signal RST applied to terminal 250 rises from L level to H level at time $t_{23}$. Until time $t_{23}$, reset signal RST has been at L level. Accordingly, the output (Q) of R-S flipflop circuit 241 is maintained at L level after time $t_{21}$ until time $t_{23}$. However, in response to reset signal RST rising to the H level at time $t_{21}$, the output (Q) of R-S flipflop circuit 241 rises to H level at time $t_{24}$. This is because R-S flipflop circuit 241 outputs an H level signal regardless of the potential of reset input (R), if the set input (S) is at H level.

In response to power-on reset signal POR attaining the H level, the potential IA of output node 231 of processing circuit 232 shown in FIG. 6 is set to the H level. In this case, however, as illustrated in FIG. 7B at (b), potential IA has already been at the H level. Accordingly, potential IA does not change at time $t_{25}$ when output node 231 is reset.

Referring to FIG. 7B at (c), assume that reset signal RST falls thereafter from H level to L level at time $t_{26}$. Thus, the set input (S) of R-S flipflop circuit 241 is at L level, while the potential of reset input (R) attains the H level. Under this condition, an L level potential signal is output to the output (Q) of R-S flipflop circuit 241. Therefore, at time $t_{27}$, power-on reset signal POR falls to the substantially ground potential.

Figure 8:
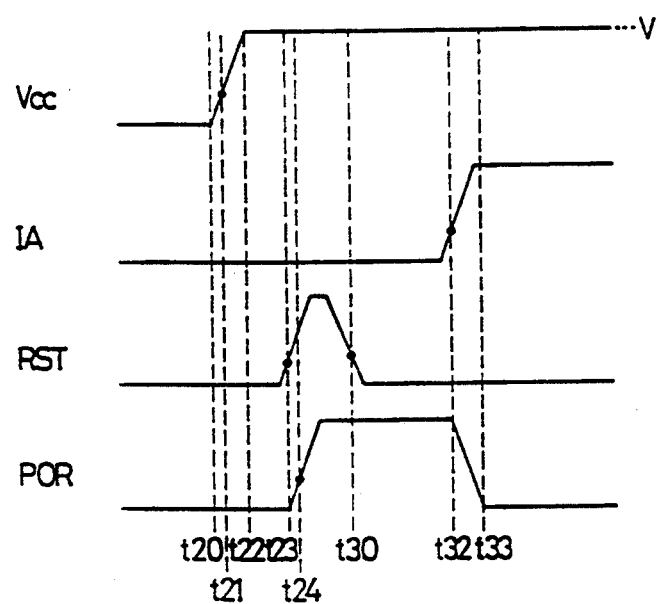

The semiconductor integrated circuit device 200 shown in FIG. 6 operates as follows when the reset signal RST is activated during a short period. Also in this case, potential IA at the time of power-up is indefinite, and therefore can take either the L level potential or the H level potential. Referring to FIG. 8, the semiconductor integrated circuit device 200 operates as follows when potential IA takes the L level potential at the time of power-up.

Referring to FIG. 8(a), at time $t_{20}$, power supply potential Vcc starts rising from L level to H level at time $t_{21}$, and reaches to the prescribed potential V at time $t_{22}$.

Referring to FIG. 8(b), the potential IA of output node 231 of processing circuit 232 shown in FIG. 6 is assumed to be at L level at the time of power-up.

Referring to FIG. 8(c), reset signal RST rises from L level to H level at time $t_{23}$.

In response to reset signal RST rising to the H level, power-on reset signal POR rises to the H level at time $t_{24}$. The operation described above is the same as the case illustrated in FIG. 7A.

In the case of FIG. 8, as opposed to FIG. 7A, reset signal RST, as illustrated in FIG. 8(c), falls from H level to L level at time $t_{30}$ after a relatively short period of time.

After time $t_{30}$, the potential of set input (S) of R-S flipflop circuit 241 attains the L level, while the potential of reset input (R) attains the L level. Under this condition, as described above, R-S flipflop circuit 241 continues to output a signal of the level which it has been outputting until then. Accordingly, after time $t_{30}$, power-on reset signal is maintained at the H level as illustrated in FIG. 8 at (d).

In response to power-on reset signal POR being at the H level, the potential IA of output node 231 of processing circuit 232 as illustrated in FIG. 8(b) rises from L level to H level at time $t_{32}$.

In response to the potential of reset input (R) attaining the H level, R-S flipflop circuit 241 outputs an L level signal. Accordingly, as illustrated in FIG. 8 at (d), power-on reset signal POR starts falling at time $t_{32}$ and falls to a substantially ground potential at time $t_{33}$.

Figure 9:
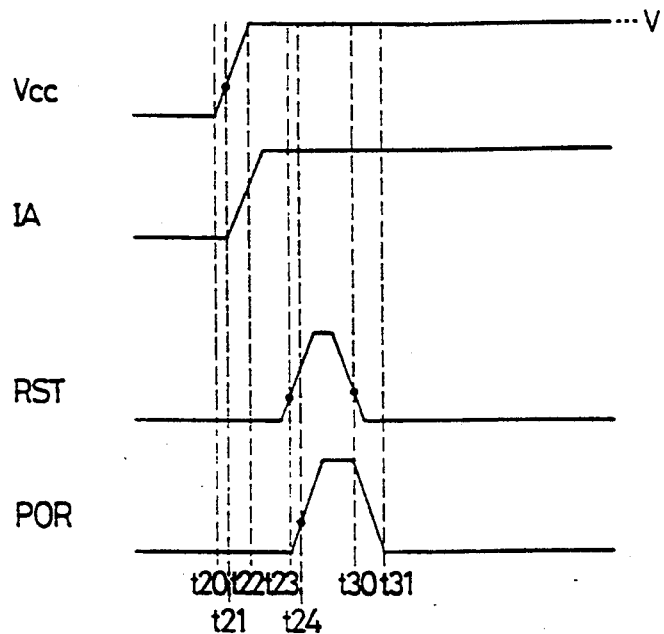

FIG. 9 is a timing chart for use in illustration of the operation of semiconductor integrated circuit device 200, when the reset signal RST is activated during a short period and potential IA attains the H level at the time of power-up. Referring to FIG. 9(a), power supply potential Vcc starts rising from the ground potential at time $t_{20}$, rises from L level to H level at time $t_{21}$ and reaches the prescribed potential V at time $t_{22}$.

Referring to FIG. 9(b), potential IA starts rising to H level at time $t_{21}$ and reaches H level after a prescribed time period.

Referring to FIG. 9(c), at time $t_{23}$, reset signal RST applied to the set input (S) of R-S flipflop circuit 241 is assumed to rise from L level potential to H level potential.

With its set input (S) being at H level, R-S flipflop circuit 241 outputs a signal of H level potential regardless of the potential of it reset input (R). More specifically, as illustrated in FIG. 9(d), power-on reset signal POR starts rising at time $t_{23}$ and transits from L level to H level at time $t_{24}$.

Referring to FIG. 9(c), after a relatively short period of time, reset signal RST is assumed to fall from H level to L level at time $t_{30}$. Thus, the set input of R-S flipflop circuit 241 attains the L level, while reset input (R) attains the H level. R-S flipflop circuit 241 as described above outputs a signal of L level potential to output (Q) under this condition. Accordingly, power-on reset signal POR, as illustrated in FIG. 9(d), falls to the substantially ground potential at time $t_{31}$ after a relatively short period of time.

In this case, however, the potential IA of output node 231 of processing circuit 232 has already risen to H level which is the reset potential as illustrated in FIG. 9(b). Therefore, even if power-on reset signal POR falls after a relatively short period of time, the potential of output node 231 is surely reset.

Stated differently, power-on reset signal POR can fall in a short period of time as illustrated in FIG. 9(d) only when the potential IA of output node 231 is the reset potential, while power-on reset signal POR maintains the H level until potential IA is equal to the reset potential as illustrated in FIG. 9(d) if the potential IA of output node 231 is not equal to the reset potential. Accordingly, potential IA is reset for sure.

FIG. 10 is a variation of the first embodiment. Semiconductor integrated circuit device 200a shown in FIG. 10 is different from semiconductor integrated circuit device 200 in that, instead of internal circuit 230 shown in FIG. 6, an internal circuit 230a having a processing circuit 232a outputting the L level as a reset potential is included and in that, instead of power-on reset signal generation circuit 240 shown in FIG. 6, power-on reset signal generation circuit 240a for outputting power-on reset signal POR is included so that a reset potential applied to second input node 260 surely attains the L level.

Power-on reset signal generation circuit 240a includes an R-S flipflop circuit 241 similar to that shown in FIG. 6, and an inverter 242 having its input connected to second input node 260 and its output connected to reset input (R) of R-S flipflop circuit 241. With inverter 242, R-S flipflop circuit 241 can perform the same operation as FIG. 6 even if the reset potential is L level. In FIGS. 10 and 6, like components are designated with like reference numerals. Their names and functions are also identical. Therefore, a detailed description thereof will not be repeated here.

A variation 200a of the semiconductor integrated circuit device according to the first embodiment of the invention illustrated in FIG. 10 operates as follows.

Figure 4:
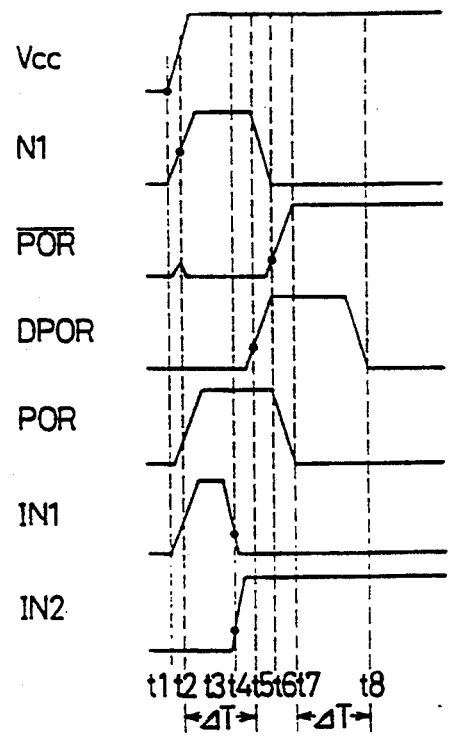
FIGS. 4 and 5 are timing charts for use in illustration of operation of a conventional power-on reset signal generation circuit.
Figure 5:
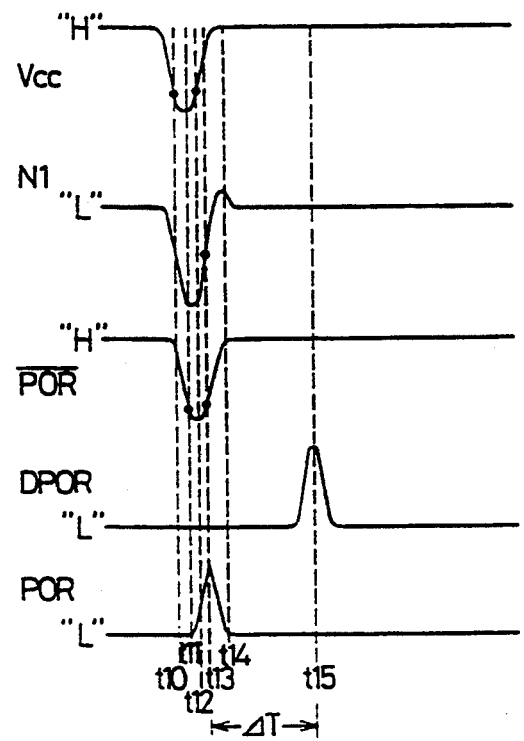

At the time of power-up the potential IA of output node 231 of processing circuit 232a becomes indefinite similarly to FIG. 4. The semiconductor integrated circuit device 200a operates as follows when potential IA attains the L level at the time of power-up. In this case, the operation of semiconductor integrated circuit device 200a is substantially identical to the operation of semiconductor integrated circuit device 200 shown in FIG. 6 except for the state of change of potential IA.

Figure 11A:
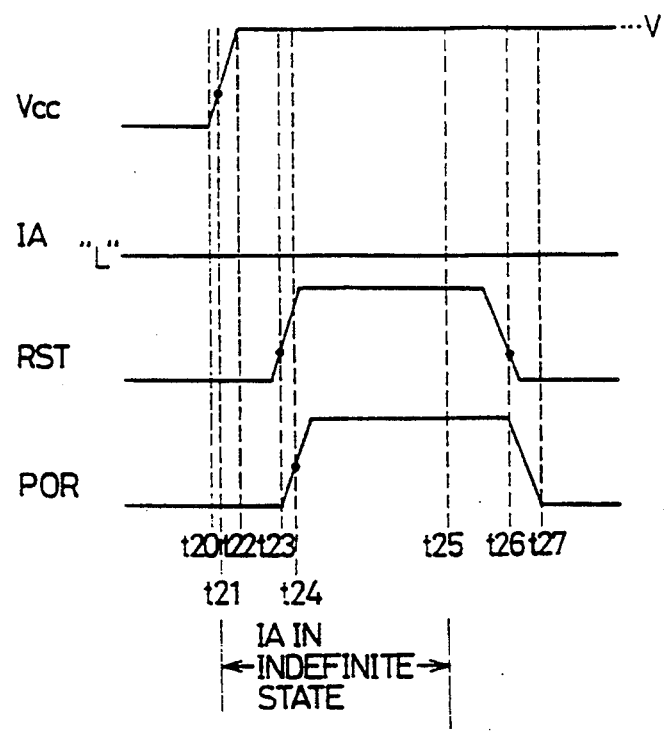
FIGS. 11A to 13 are timing charts for use in illustration of the operation of the variation of the first embodiment of the invention.

Referring to FIG. 11A at (b), in semiconductor integrated circuit device 200a, potential IA is set to the reset potential at time $t_{25}$, but in this case potential IA has already been the reset potential (L level). Therefore, there is no change in the level of potential IA at time $t_{25}$. Also in the case shown in FIG. 11A at (b), after time $t_{27}$ (see FIG. 11A at (d)) at which power-on reset signal POR falls, potential IA surely becomes the reset potential (L level).

Figure 11B:
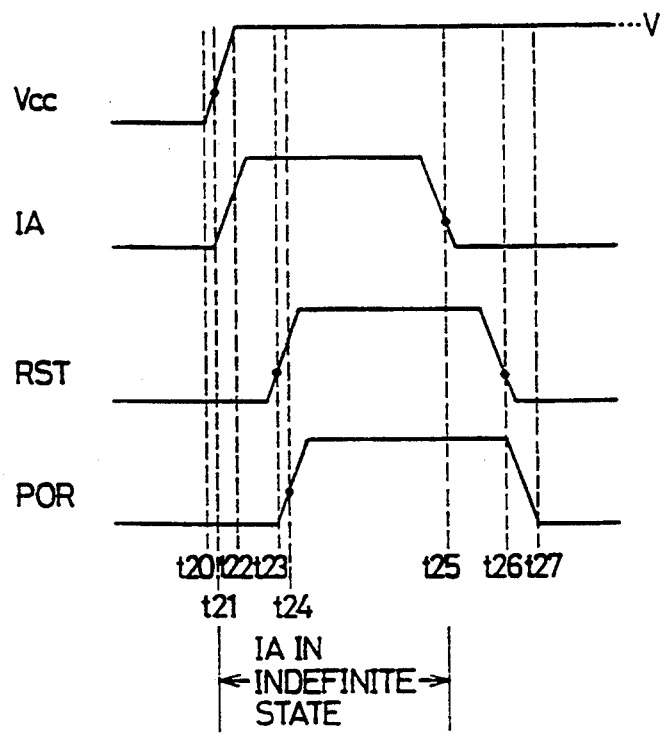

Now referring to FIG. 11B, the semiconductor integrated circuit device 200a shown in FIG. 10 operates as follows when potential IA attains the H level at the time of power-up. The operation of semiconductor integrated circuit device 200a in this case is identical to the operation shown in FIG. 7B of semiconductor integrated circuit device 200 shown in FIG. 6. FIG. 11B is different from FIG. 7 in that at time $t_{25}$, potential IA is reset by processing circuit 232a, and falls from H level to L level. Thus, reset signal RST (see FIG. 11B at (c)) falls to L level at time $t_{26}$. When power-on reset signal POR (FIG. 11B at (d)) is the substantially ground potential at time $t_{27}$, potential IA surely attains the reset potential (L level).

Semiconductor integrated circuit device 200a shown in FIG. 10 operates as follows when reset signal RST input to first input node 250 is in the H level in a short period of time. Also in this case, the level of potential IA at the time of power-up supply is indefinite. Accordingly, the cases in which potential IA at the time of power-up is at L level and H level, respectively, will be described in conjunction with FIGS. 12 and 13, respectively.

Referring to FIG. 12(a), it is assumed that power supply potential Vcc starts rising at time $t_{20}$, rises from L level to H level and becomes the described potential V at $t_{22}$.

Referring to FIG. 12(b), potential IA is assumed to maintain the L level regardless of the state of the power supply.

Referring to FIG. 12(c), reset signal RST input to first input node 250 rises from L level to H level at time $t_{23}$, and returns to L level at time $t_{30}$ after a relatively short period of time.

The potential of reset input (S) to R-S flipflop circuit 241 shown in FIG. 10 is H level, the input of inverter 242 is L level, and the potential of reset input (R) of R-S flipflop circuit 241 is H level. More specifically, referring to FIG. 12(d), power-on reset signal POR starts rising after time $t_{23}$ and attains the H level at time $t_{24}$.

After time $t_{30}$, the potential of set input (S) of R-S flipflop circuit 241 returns to the L level. In this case, the output of R-S flipflop circuit 241 attains the L level. Accordingly, after time $t_{30}$, as illustrated in FIG. 12(d), power-on reset signal POR starts falling and falls to the substantially ground potential at time $t_{31}$.

In this case as illustrated in FIG. 12(b), potential IA is L level since the time of power-up and is kept at the L level even if reset signal RST once rises and then falls after a short period of time. More specifically, even if the activation period for reset signal RST is short, potential IA surely maintains the reset potential.

Now, semiconductor integrated circuit device 200a operates as follows when potential IA is in H level at the time of power-up.

Figure 12:
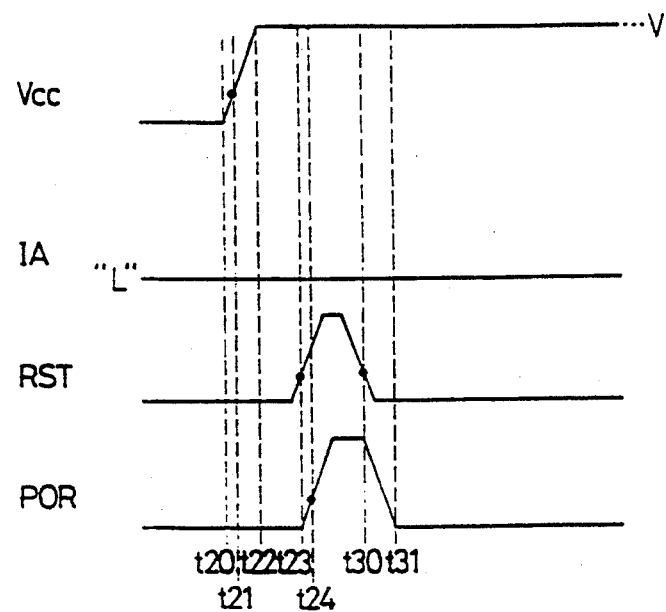
Figure 13:
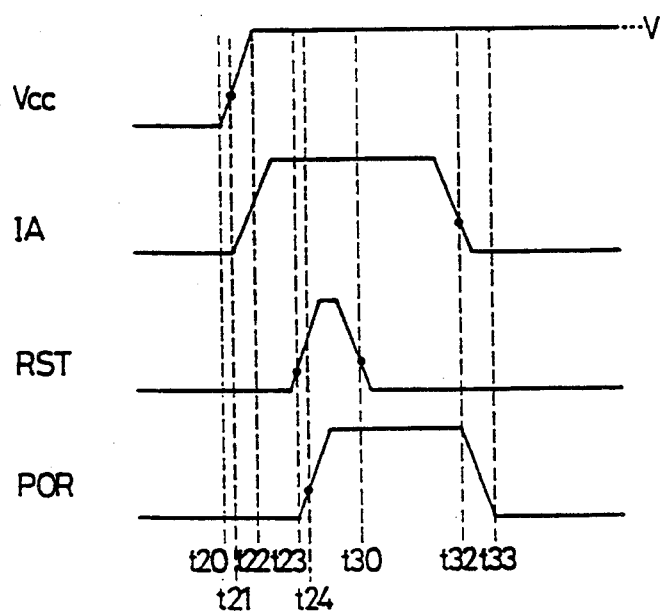

Referring to FIG. 13(a), it is assumed that power supply potential Vcc changes in the same manner as in FIG. 12.

Referring to FIG. 13(b), it is assumed that potential IA starts rising at time $t_{21}$ and then attains the H level.

Referring to FIG. 13(c), it is assumed that reset signal RST rises from L level to H level at time $t_{23}$, and falls to L level at time $t_{30}$ after a relatively short period of time.

From time $t_{23}$ to time $t_{30}$, the potential of set input (S) of semiconductor integrated circuit 241 (FIG. 10) is H level, the input of inverter 242 is H level, the reset input (R) of R-S flipflop circuit 241 is L level. Accordingly, at the output (Q) of R-S flipflop circuit 241, H level potential appears. More specifically, referring to FIG. 13(d), power-on reset signal POR starts rising at time $t_{23}$ and attains the H level at time $t_{24}$.

From time $t_{30}$ to $t_{32}$, the potential of set input (S) of R-S flipflop circuit 241 is in L level, the input of inverter 241 is in H level, and potential of reset input (R) of R-S flipflop circuit 241 is in L level. Accordingly, R-S flipflop circuit 241 continues to output the signal of the level which it has been outputting until then. As illustrated in FIG. 13(d), even if reset signal RST falls to L level at time $t_{30}$, power-on reset signal POR maintains its H level as illustrated in FIG. 13(a).

In response to power-on reset signal POR being at H level, the potential of output node 231 of processing circuit 232a shown in FIG. 10 becomes the reset potential, in other words the L level. Assume that this takes place at time $t_{32}$ as illustrated in FIG. 13(b). After time $t_{32}$, the potential of set input (S) of R-S flipflop circuit 241 is in L level, the potential of input of inverter 242 is in L level, and the potential of reset input (R) of R-S flipflop circuit 241 is in H level. Accordingly, R-S flipflop circuit 241 outputs a signal of L level.

More specifically, referring to FIG. 13(d), power-on reset signal POR starts falling at time $t_{32}$ and becomes the substantially ground potential at time $t_{33}$.

As described above, power-on reset signal POR does not fall to the ground potential unless the potential IA of output node 231 of processing circuit 232a attains L level. Accordingly, resetting of the potential of output node 231 to L level by processing circuit 232a can surely be performed.

In the semiconductor integrated circuit device according to the first embodiment of the invention described above, if the potential IA of output node 231 of the processing circuit at the time of the power-up is equal to the reset potential, power-on reset signal POR is output as follows so as to securely reset potential IA of output node 231 of the processing circuit, even if reset signal RST is activated only in a short period of time. With potential IA being indefinite at the time of power-up, if potential IA is equal to the reset potential, power-on reset signal POR immediately falls to the ground potential when the activation period for reset signal RST is completed. In this case, however, since potential IA has already been equal to the reset potential, it is justifiable to consider that reset of potential IA is secured. Meanwhile, if potential IA at the time of power-up is different from the reset potential, power-on reset signal POR will not immediately fall to the ground potential even if the activation period for reset signal RST is completed. Power-on reset signal POR does not fall to the ground potential unless potential IA becomes the reset potential. Therefore, also in this case, potential IA can surely be reset.

Second Embodiment

Now, a semiconductor integrated circuit device 300 according to a second embodiment of the invention will be described in conjunction with FIGS. 14–17.

Figure 1:
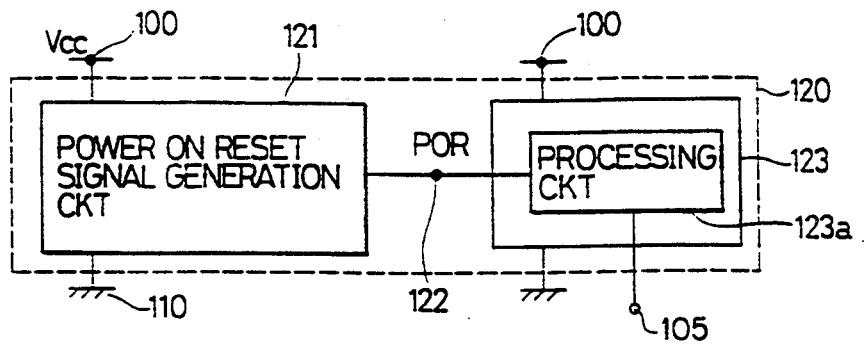
FIG. 1 is a block diagram showing a conventional semiconductor integrated circuit including a power-on reset signal generation circuit.
Figure 2:
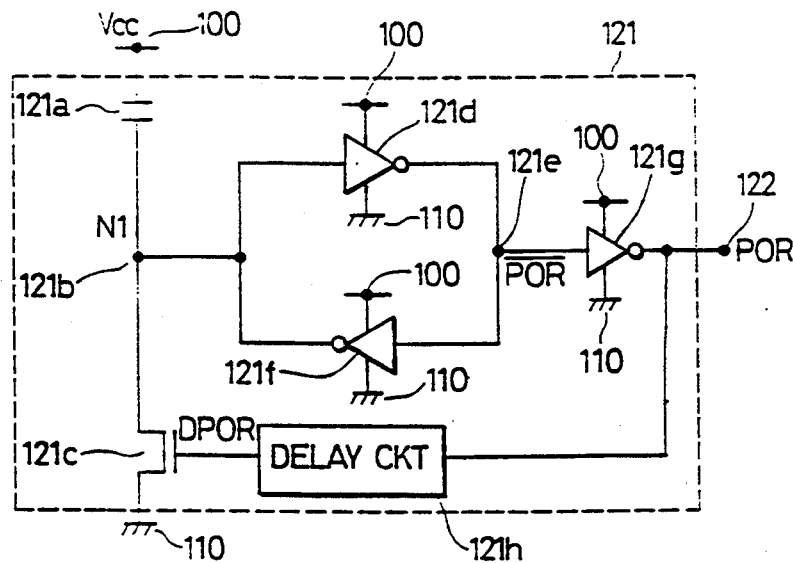
FIG. 2 is a circuit diagram showing a conventional power-on reset generation circuit.
Figure 3:
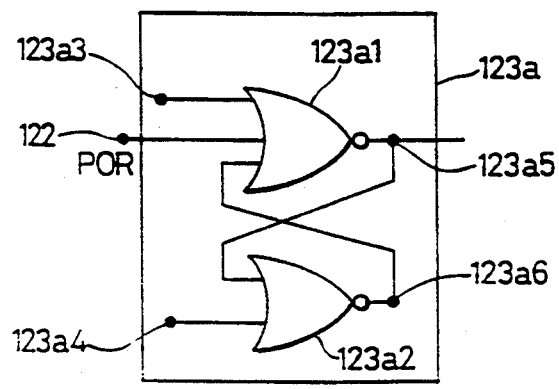
FIG. 3 is a circuit diagram showing one example of a processing circuit included in an internal circuit.
Figure 14:
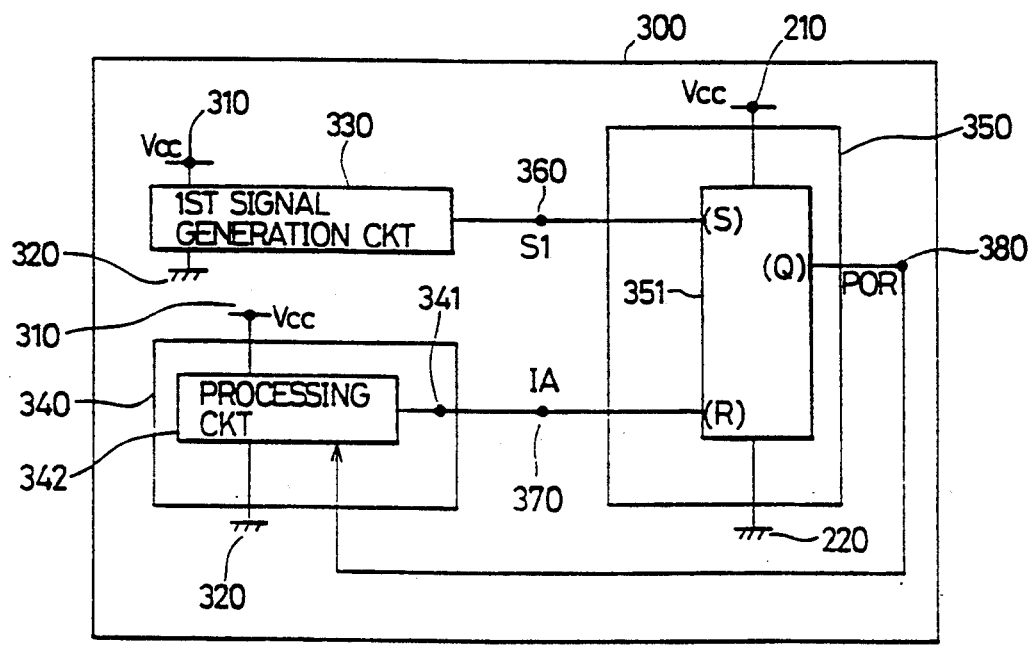
FIG. 14 is a block diagram showing a semiconductor integrated circuit device according to a second embodiment of the invention.

Referring to FIG. 14, semiconductor integrated circuit device 300 according to the second embodiment includes power supply potential nodes 310 and 210 supplied with power supply potential Vcc, and ground potential nodes 220 and 320. Semiconductor integrated circuit device further includes a first signal generation circuit 330 powered by power supply potential Vcc supplied from power supply potential node 310 for outputting a first signal S1 to node 360. First signal generation circuit 330 includes a conventional power-on reset signal generation circuit 121 as shown in FIG. 1, for example. First signal S1 rises from L level to H level in response to power supply potential Vcc rising from ground potential to a prescribed potential (5 V, for example) and falls to L level after a prescribed time period.

Semiconductor integrated circuit device 300 further includes an internal circuit 340 powered by power supply potential Vcc from power supply potential node 310 for processing input signals and outputting the same. Internal circuit 340 includes a processing circuit 342 connected to power supply potential node 310 and ground potential node 320 and having an output node 341. Processing circuit 342 responds to power-on reset signal POR applied from a second signal generation circuit 350 which will be described later and resets the potential IA of output node 341 to a reset potential. The potential of output node 341 of processing circuit 342 attains an indefinite state at the time of power up of Vcc, because the input signals to processing circuit 342 are in an inactive state. In the indefinite state, it cannot be determined whether the potential IA of output node 341 is L level or H level.

Semiconductor integrated circuit device 300 further has second signal generation circuit 350 connected to power supply potential node 210 and ground potential node 220, powered by power supply potential node 210 to operate, and having a first input connected to node 360, and a second input connected to node 370, and an output node 380 for outputting power-on reset signal POR in response to first signal S1 and potential IA.

Node 360 is connected to the output of signal generation circuit 330. Node 370 is connected to the output node 341 of processing circuit 342. Output node 380 is connected to an input for power-on reset signal.

Second signal generation circuit 350 includes an R-S flipflop circuit 351 connected between power supply potential node 210 and ground potential node 220 and having a set input (S) connected to node 360, a reset input (R) to node 370, and an output (Q) to output node 380.

Second signal generation circuit 350 serves to apply an output of a prescribed potential to output node 380 in response to first signal S1 output from first signal generation circuit 330 and the potential IA of output node 341 of processing circuit 342. A signal appearing at output node 380 is power-on reset signal POR. Power-on reset signal POR rises in response to first signal S1 rising from L level to H level and falls after potential IA of second input node 370 becomes or reaches the reset potential. The operation of second signal generation circuit 350 will be described later.

In the case of FIG. 14, when reset, the potential IA of output node 341 of processing circuit 342 becomes the H level potential. The semiconductor integrated circuit device in which the reset potential is L level will be described as a variation of this embodiment in conjunction with FIGS. 18 and so on.

The semiconductor integrated circuit device 300 operates as follows when the activation period for first signal S1 output from first signal generation circuit 330 is long. In the following description, first signal S1 is assumed to be at H level when activated and at L level when deactivated.

Figure 15A:
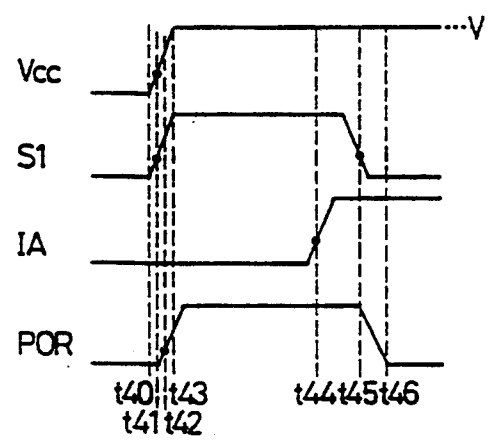
FIGS. 15A–17 are timing charts for use in illustration of the operation of the semiconductor integrated circuit device according to the second embodiment of the invention.

Referring to FIG. 15A at (a), at time $t_{40}$ power supply potential Vcc starts rising, rises to H level exceeding a prescribed threshold voltage at time $t_{41}$, and at time $t_{42}$ reaches a prescribed potential (5 V in the case of this embodiment). First signal generation circuit 330 receiving potential Vcc from power supply potential node 310 outputs first signal S1 as illustrated in FIG. 15A at (b). More specifically, first signal S1 rises from ground potential with a rising of potential Vcc, becomes H level at time $t_{42}$ and becomes approximately 5 V (H level) at time $t_{43}$. First signal S1 falls to L level at time $t_{45}$ after a relatively long activation period.

As illustrated in FIG. 15A at (c), at the time of power-up, the power supply potential IA of output node 341 of processing circuit 342 is indefinite but in this case it is assumed to stay at L level.

Referring back to FIG. 14, after the rising of power supply potential Vcc, from time $t_{41}$ to time $t_{45}$, the potential of set input (S) of R-S flipflop circuit 351 is at H level, the potential IA of reset input is at L level. Since R-S flipflop circuit 351 is the set-preferential type, H level signal is output to its output (Q). More specifically, as illustrated in FIG. 15A at (d), power-on reset signal POR starts rising at time $t_{41}$ and rises to H level at time $t_{42}$.

Processing circuit 342 sets the potential IA of output node 341 to be reset potential as illustrated at time $t_{44}$ in FIG. 15A at (c) in response to power-on reset signal POR attaining H level. More specifically, potential IA rises to H level at time $t_{44}$.

When first signal S1 falls as illustrated in FIG. 15A at (b) at time $t_{45}$, the potential of set input (S) of R-S flipflop circuit 351 attains the L level, and the potential of reset input (R) attains the H level. Accordingly, an L level potential appears at the output Q of R-S flipflop circuit 351.

More specifically, as illustrated in FIG. 15A at (d), power-on reset signal POR starts falling at time $t_{45}$ and then falls to a substantially ground potential at time $t_{46}$.

If the period in which first signal S1 is at H level (activated) is long enough, potential IA can surely be reset by power-on reset signal POR.

Now, the case will be described in which potential IA attains the H level in the indefinite state at the time of power-up.

Figure 15B:
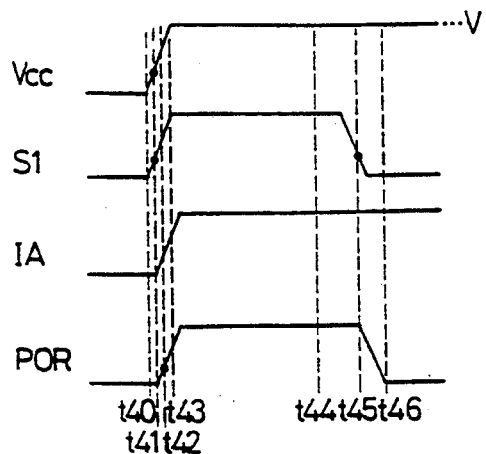

FIG. 15B is identical to FIG. 15A except for FIG. 15B at (c). Referring to FIG. 15B at (c), potential IA rises to H level as power supply potential Vcc rises. Then, potential IA is set to the reset potential at time $t_{44}$. In this case, however, because potential IA has already been at the level of reset potential (H level), potential IA does not change. Then, at time $t_{45}$, first signal S1 falls to L level. Power-on reset signal POR falls to the ground potential in response, but potential IA has already been at the level of reset potential as described above.

The semiconductor integrated circuit device 300 operates as follows when first signal S1 is activated during only a short period of time due to instantaneous failure of power supply potential Vcc supplied to power supply potential node 310. Semiconductor integrated circuit device 300 can advantageously output power-on reset signal to surely reset potential IA even if the activation period for first signal S1 is as short as this.

Suppose potential IA is at L level in its indefinite state.

Referring to FIG. 16(a), it is assumed that power supply potential Vcc transits from H level to L level at time $t_{50}$ and rises once again to H level at time $t_{51}$. The period during which potential Vcc is at L level is very short.

Referring to FIG. 16(b), in response to potential Vcc once again rising to H level, first signal S1 rises to H level at time $t_{51}$ and falls to L level at time $t_{53}$. The period during which first signal S1 is at H level is very short.

During the period from time $t_{50}$ to time $t_{51}$, the potential of set input (S) of R-S flipflop circuit 351 is at L level, and the potential of reset input (R) is at L level. Accordingly, at its output (Q), the potential until then is held. Therefore, power-on reset signal POR during this period is at L level.

During the period from time $t_{51}$ to time $t_{53}$, the set input (S) of R-S flipflop circuit 351 is at H level, and potential of reset input (R) is at L level. Accordingly, an H level signal appears at the output (Q) of R-S flipflop circuit 351. More specifically, referring to FIG. 16 (d), at time $t_{52}$ in the period from $t_{51}$ to $t_{53}$, power-on reset signal POR rises from L level to H level.

When at time $t_{53}$ first signal S1 falls to L level, the potential of set input (S) of R-S flipflop circuit 351 attains the L level. Since the potential of reset input (R) is at L level, during the period from $t_{53}$ to $t_{55}$, R-S flipflop circuit 351 falls to the previous potential level, in other words to H level.

In response to power-on reset signal POR attaining H level, the potential IA of output node 341 of processing circuit 342 rises from L level to H level as illustrated in FIG. 16(e) at time $t_{55}$.

Referring to FIG. 14, the set input (S) of R-S flipflop circuit 351 is at L level, reset input (R) is at H level, and therefore R-S flipflop circuit 351 outputs an L level signal to its output (Q). More specifically, as illustrated in FIG. 16(d), power-on reset signal POR falls to the substantially ground potential at time $t_{56}$.

Figure 16:
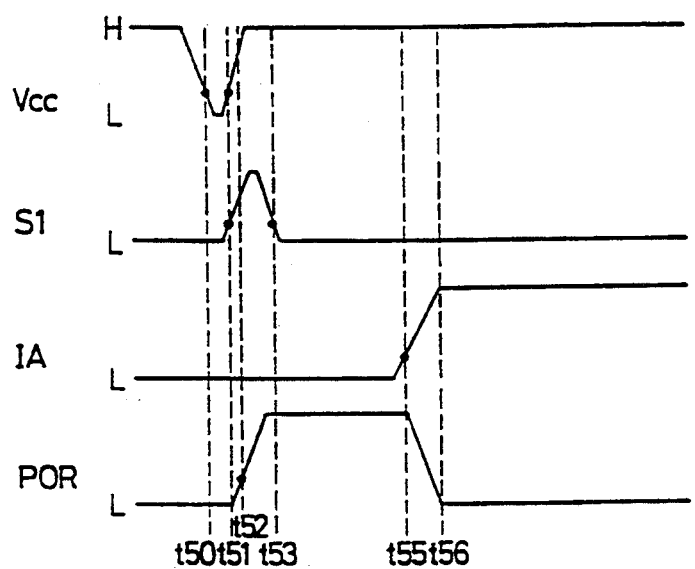

In the case shown in FIG. 16, power-on reset signal POR does not fall to the ground potential until potential IA rises from L level to H level. Accordingly, potential IA is surely reset to H level.

Figure 17:
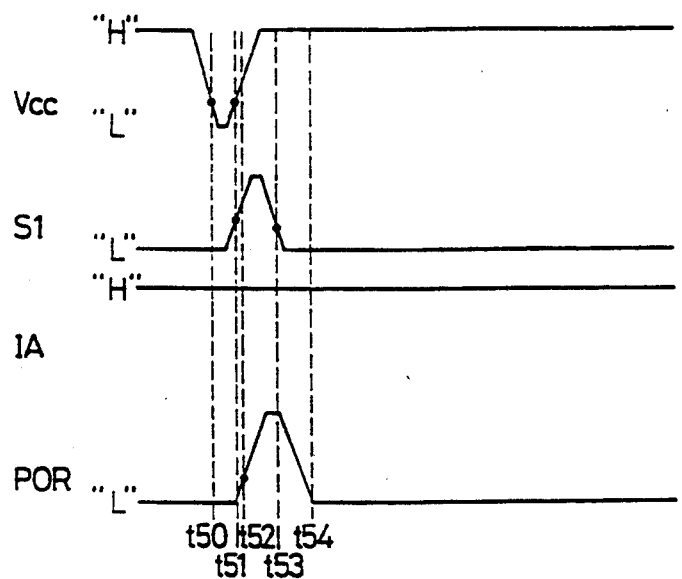

Referring to FIG. 17, the semiconductor integrated circuit device 300 operates as follows when potential IA is at H level in its indefinite state.

Operation of semiconductor integrated circuit device 300 until time $t_{53}$ is identical to that shown in FIG. 16 with difference being that potential IA is at H level (see FIG. 17(c)).

At time $t_{53}$, as illustrated in FIG. 17(b), first signal S1 falls to L level. Then, the potential of set input (S) of R-S flipflop circuit 351 in FIG. 14 attains L level, and the potential of reset input (R) attains H level. R-S flipflop circuit 351 sets the potential of output (Q) to L level.

As illustrated in FIG. 17(d), power-on reset signal POR starts falling at time $t_{53}$ and reaches the substantially ground potential at time $t_{54}$.

In the case shown in FIG. 17, power-on reset signal POR falls to the ground potential immediately after first signal S1 falls. In this case, however, since potential IA has already been at H level and is maintained there, there will be no problem even if power-on reset signal POR falls after a relatively short activation period.

Figure 18:
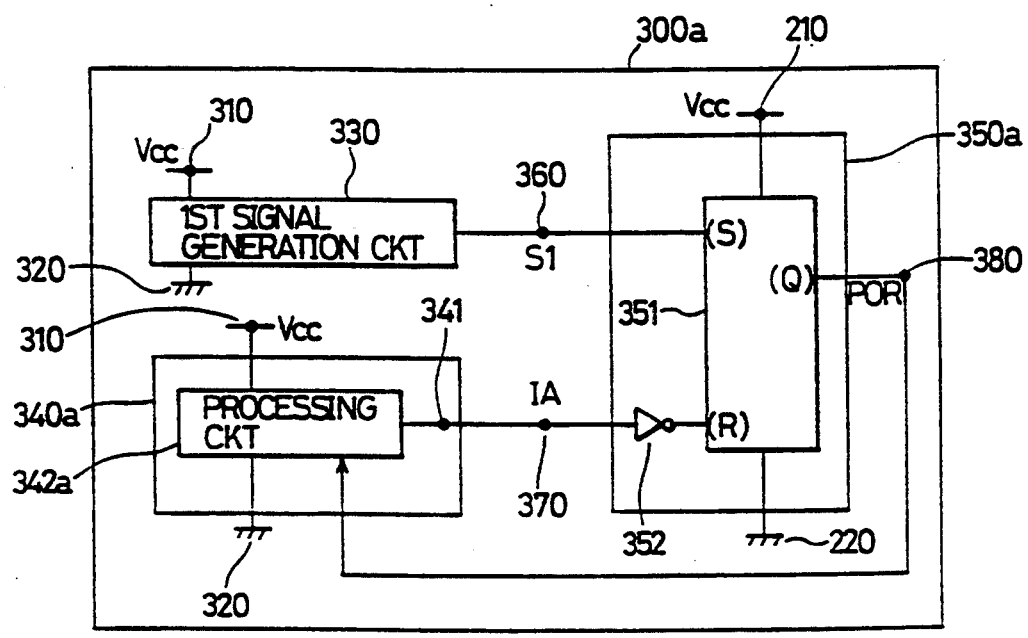
FIG. 18 is a block diagram showing a variation of a semiconductor integrated circuit device according to the second embodiment.

FIG. 18 is a block diagram showing semiconductor integrated circuit device 300a according to a variation of the second embodiment. Semiconductor integrated circuit device 300a shown in FIG. 18 is different from semiconductor integrated circuit device 300 shown in FIG. 14 in that an internal circuit 340a and a processing circuit 342a are provided instead of internal circuit 340 and processing circuit 342, respectively, and that a second signal generation circuit 350a is provided instead of second signal generation circuit 350. The reset potential of output node 341 is not at H level but at L level.

Processing circuit 342a resets the potential of output node 341 to L level which is the reset potential, in response to power-on reset signal POR applied from second signal generation circuit 350a.

Second signal generation circuit 350a includes in addition to second signal generation circuit 350 shown in FIG. 14, an inverter 352 having an input connected to second input node 370 and an output connected to the reset input of R-S flipflop circuit 351. In this embodiment, the reset potential of potential IA is reversed from the case shown in FIG. 14. Inverter 352 inverses potential IA and applies the inverted potential to the reset input (R) of R-S flipflop circuit 351. The operation of semiconductor integrated circuit device 300a according to the variation of the second embodiment will be readily understood from that of semiconductor integrated circuit device 300 shown in FIG. 14.

Figure 19A:
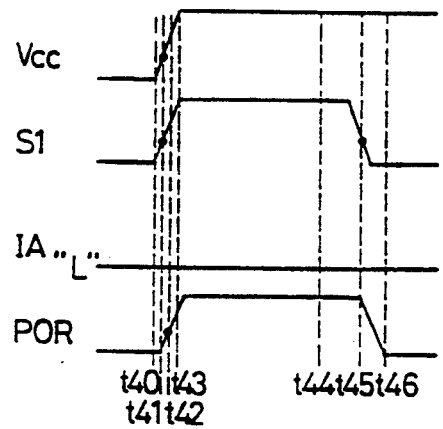
FIGS. 19A–21 are timing charts for use in illustration of the operation of the semiconductor integrated circuit device according to the variation of the second embodiment of the invention.

In FIG. 19A, for example, operation of semiconductor integrated circuit device 300a with potential IA attaining the L level in the indefinite state is illustrated. FIG. 19A is substantially identical to FIG. 15B, and only 19A at (c) showing potential IA is slightly different from FIG. 15B at (c). FIG. 19A at (a) is substantially identical to the reversed version of FIG. 15B at (c). It should be noted, however, that potential IA in FIG. 19A before the power-up is at L level, because potential IA is at L level at the time of power-up.

Figure 19B:
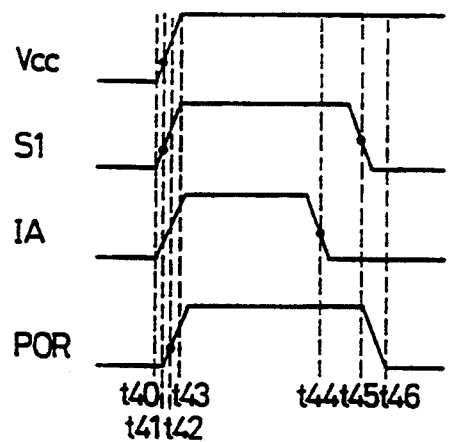

FIG. 19B is substantially identical to FIG. 15A except for FIG. 19B at (c).

FIG. 19B at (c) is substantially identical to the reversed version of the timing chart shown in FIG. 15A at (c). Accordingly, potential IA in FIG. 19B at (c) is at L level before the power-up and does not rise to H level until time $t_{42}$. Except for the period before time $t_{42}$, FIG. 19B at (c) is identical to the reversed version of FIG. 15A at (c). Operation of semiconductor integrated circuit device 300a in this case is substantially identical to the operation of semiconductor integrated circuit device 300 shown in FIG. 14, and therefore a detailed description thereof will not be repeated here.

Figure 20:
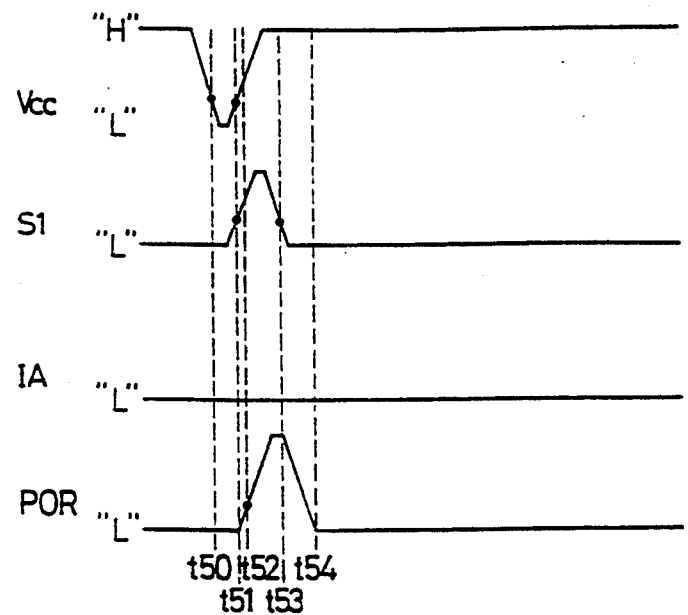
Figure 21:
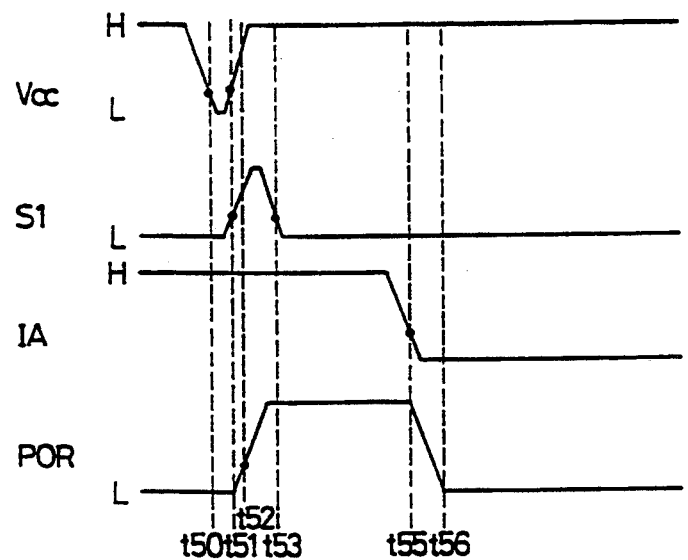

FIGS. 20 and 21 show operation of semiconductor integrated circuit device 300a when power supply potential Vcc attains the L level for a short period of time due to instantaneous power failure or the like. FIG. 20 shows an operation when potential IA is at L level while FIG. 21 the case in which potential IA is at H level.

FIG. 20 is identical to FIG. 17 except for FIG. 20(c). FIG. 20(c) is equal to the inverted version of FIG. 17(e). FIG. 21 is equal to FIG. 16 except at (c). FIG. 21 at (c) is the inverted version of FIG. 16 at (c). Inverting potential IA with inverter 352 provides a signal exactly the same as in the case shown in FIG. 14. Therefore, a detailed description of the operation of semiconductor integrated circuit device 300a will not be repeated here.

In semiconductor integrated circuit devices 300 and 300a which represent the second embodiment of the invention described above and a variation thereof, resetting of potential IA is surely performed as follows. If the potential of potential IA in an indefinite state matches a reset potential, there will be no problem even if the reset signal is activated only in a short period of time. If potential IA in the indefinite state is different from the reset potential, power-on reset signal POR does not fall to the ground potential until the potential IA of output node 341 is reset to the reset potential. Therefore, potential IA is surely reset in the same manner as the first embodiment.

Third Embodiment

Figure 22:
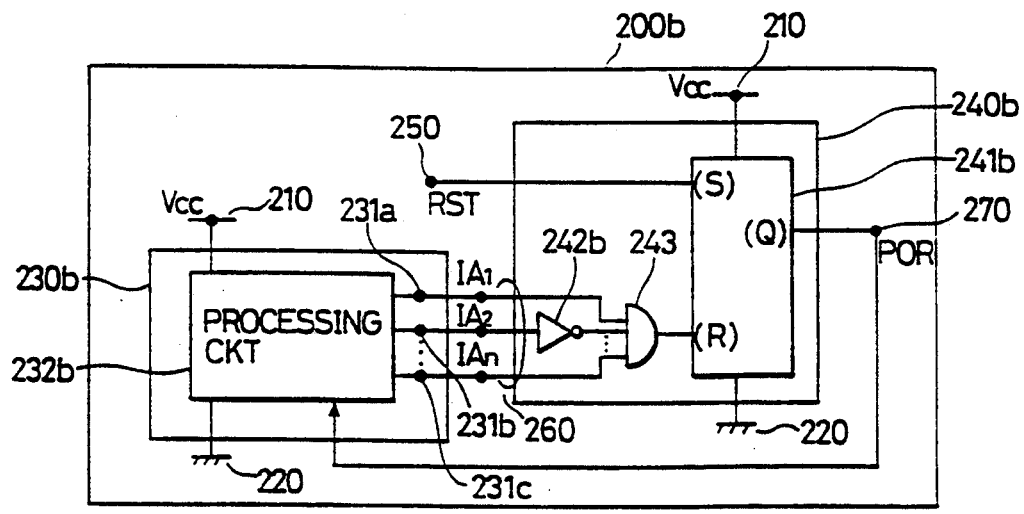
FIG. 22 is a block diagram showing a semiconductor integrated circuit device according to a third embodiment of the invention.

Now, a semiconductor integrated circuit device according to a third embodiment of the invention will be described. Referring to FIG. 22, semiconductor integrated circuit device 200b includes an internal circuit 230b having a processing circuit 232b, and a power-on reset signal generation circuit 240b. Power-on reset signal generation circuit 240b has a first input node 250 and second input nodes 260 receiving a plurality of inputs, and serves to output to an output node 270 a power-on reset signal POR in response to a reset signal RST input to first input node 250 and potentials IA1–IAn (n: integer) to second input nodes 260.

Power-on reset signal POR is applied to processing circuit 232b. Processing circuit 232b has a plurality of output nodes 231a–231c which are reset to prescribed potentials in response to power-on reset signal POR attaining H level. Each of output nodes 231a–231c is connected to a separate input of second input nodes 260. The above-described potentials IA1–IAn represent the potentials of these output nodes 231a–231c. Processing circuit 232b is connected to a power supply potential node 210 and a ground potential node 220, and receives power supply potential Vcc from power supply potential node 210 to operate.

Note that among the plurality of output nodes 231a–231c, the reset potential of output node 231b is L level, and the reset potentials of the other output nodes are H level.

Power-on reset signal generation circuit 240b includes n-input AND gates 243 having inputs connected to the plurality of inputs of second input nodes 260, respectively, and an R-S flipflop circuit 241b having a set input (S) connected to first input node 250, a reset input (R) connected to the output of n-input AND gate 243, and an output (Q) connected to output node 270. Among the inputs of n-input AND gate 243, an input portion connected to the output node 231b of processing circuit 232b is connected to an output of an inverter 242b. Accordingly, the potential IA2 of output node 231b is inverted by inverter 242b and applied to n-input AND gate 243. Output node 270 is connected to an input for power-on reset signal POR of processing circuit 232b.

R-S flipflop circuit 241b is the same as R-S flipflop circuit 241 shown in FIG. 18. Therefore, its operation is the same as that in the first embodiment and second embodiment.

Note that the output nodes 231a–231c of processing circuit 232b attain an indefinite state, when power supply potential Vcc rises. More specifically, it cannot be determined whether the potentials IA1–IAn of output nodes 231a–231c are H level or L level at the time of power-up.

Like components are provided with like names and reference numerals in FIGS. 22, 6, 10, 14 and 18. Their functions are also identical. Accordingly, the detailed description thereof will not be repeated here.

Figure 23:
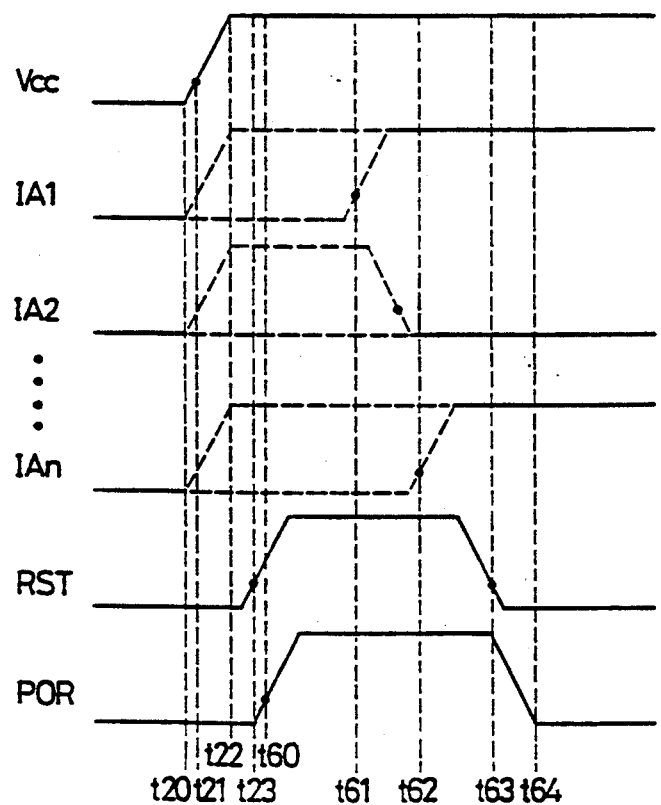
FIGS. 23 and 24 are timing charts for use in illustration of operation of the semiconductor integrated circuit device according to the third embodiment of the invention.

Referring to FIG. 23, if an activation period for reset signal RST applied to first input node 250 is long enough, semiconductor integrated circuit device 200b operates as follows. Note that in the following description, reset signal RST remains at H level during its activation period.

Referring to FIG. 23 at (a), the potential Vcc of power supply potential node 210 starts rising from the ground potential, becomes H level exceeding a prescribed threshold voltage at time $t_{21}$, and reaches the prescribed potential 5 V at time $t_{22}$.

Referring to FIGS. 23(b)–(d), at time $t_{22}$, the potentials IA1–IAn of output nodes 231a–231c of processing circuit 232b are indefinite. More specifically, as indicated in dotted line in FIGS. 23(b)–(d), it cannot be determined whether potentials IA1–IAn are L level or H level.

Referring to FIG. 23(e), it is assumed that reset signal RST rises from L level to H level at time $t_{23}$. Reset signal RST once again falls to L level potential at time $t_{63}$ after a sufficiently long period of time.

Referring back to FIG. 22, R-S flipflop circuit 241b sets the potential of its output (Q) to H level if the potential of set input (S) is at H level. Accordingly, as illustrated in FIG. 23(f), power-on reset signal POR rises from L level to H level at time $t_{60}$ slightly delayed from time $t_{23}$.

Then, during the period from time $t_{61}$ to time $t_{62}$, for example, the potentials IA1–IAn of output nodes 231a–231c are all reset to reset potential. If, for example, potential IA1 is at L level in an indefinite state, it is reset to H level in this period, while if at H level in the indefinite state, it maintains the H level. If potential IA2 is at L level before time $t_{61}$, it maintains the L level, and if at H level, it is reset during the period between time $t_{61}$ and $t_{62}$.

Referring to FIG. 22, potentials whose reset potentials are the H level are directly applied to n-input AND gate 243. Potentials whose reset potentials are the L level are inverted by inverter 242b to attain H level, and applied to n-input AND gate 243. Thus resetting all the potentials renders all the inputs of n-input AND gate 243 be at H level, and the output of n-input AND gate 243 attains H level. The potential of reset input (R) of R-S flipflop circuit 241b changes from L level to H level. More specifically, the potential of reset input (R) attains H level at time $t_{62}$.

During the period from time $t_{62}$ to $t_{63}$, the potential of set input (S) of R-S flipflop circuit 241b is at H level, and potential of reset input (R) is at H level. Accordingly, its output (Q) maintains the H level, and power-on reset signal POR maintains the H level as illustrated in FIG. 23(f).

Reset signal RST falls to L level at time $t_{63}$. The potential of set input (S) of R-S flipflop circuit 241b is at L level, and the potential of reset input (R) is at H level. Accordingly, the potential of the output (Q) of R-S flipflop circuit 241b attains L level. As illustrated in FIG. 23(f), power-on reset signal POR starts falling at time $t_{63}$ and falls to the substantially ground potential at time $t_{64}$.

Accordingly, as illustrated in FIG. 23, if the activation period for reset signal RST is long enough, all the potentials IA1–IAn are reset to respective reset potentials during the period in which power-on reset signal POR is maintained at H level.

Figure 24:
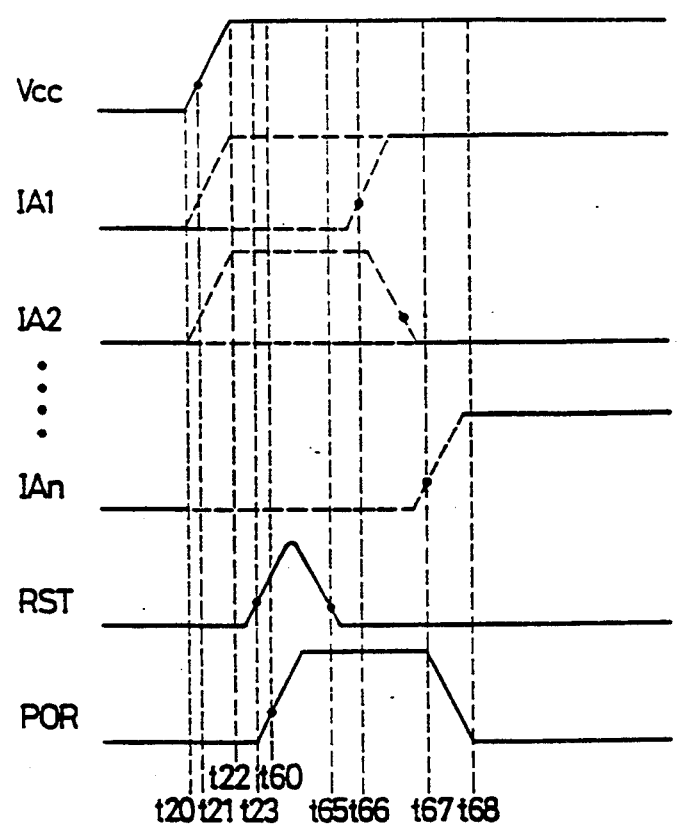

Referring to FIG. 24, if the activation period for reset signal RST input to first input node 250 is short, semiconductor integrated circuit device 200b operates as follows.

Referring to FIG. 24(a), power supply potential Vcc starts rising from the ground potential at time $t_{20}$, changes its level from L level to H level at time $t_{21}$, and reaches 5 V at time $t_{22}$.

As illustrated in FIG. 24(e), reset signal RST changes its level from L level to H level at time $t_{23}$ and once again falls to L level at time $t_{65}$ after a relatively short period of time.

Up to time $t_{23}$, potentials IA1–IAn change in the same manner as those in FIG. 23 as illustrated in FIG. 24(b)–(d).

Referring to FIG. 24(f), in response to reset signal RST attaining H level at time $t_{23}$, power-on reset signal POR starts rising at time $t_{23}$, then attains H level at time $t_{60}$ and reaches a prescribed potential. With power-on reset signal POR attaining the H level, potentials IA1–IAn are reset to respective reset potentials. These potentials are assumed to be reset during the period $t_{66}$–$t_{67}$ as illustrated in FIG. 24. Accordingly, in this case, if power-on reset signal POR falls to the ground potential before time $t_{67}$, there is a possibility that resetting is not completed. In the semiconductor integrated device according to the third embodiment, resetting is surely performed as follows.

During the period $t_{23}$–$t_{65}$, the potential of set input (S) of R-S flipflop circuit 241b shown in FIG. 22 is at H level, the potential of reset input (R) is indefinite (although it is likely to be at L level). R-S flipflop circuit 241b outputs an H level signal to its output (Q), regardless of the potential of reset input (R), if the potential of set input (S) is at H level. Accordingly, during this period, power-on reset signal POR is at H level as shown in FIG. 24(f).

Semiconductor integrated circuit device 200b after reset signal RST falls to L level at time $t_{65}$ operates as follows. The set input (S) of R-S flipflop circuit 241b is at L level. If any of potentials IA1–IAn is not yet reset, the output of n-input AND gate 243 is at L level. In such a case, R-S flipflop circuit 241b outputs a signal of the same level as the previous output level. During this period, the potential of output (Q) of R-S flipflop circuit 241b is maintained at H level.

The output of n-input AND gate 243 does not attain H level until all the potentials IA1–IAn are reset. In response to the reset input (R) of R-S flipflop circuit 241b attaining H level, the potential of output (Q) of R-S flipflop circuit 241b falls to L level.

More specifically, as illustrated in FIG. 24(f), power-on reset signal POR does not fall to the ground potential until all the potentials IA1–IAn are reset after reset signal RST falls. Accordingly, even if reset signal RST is inactivated after a relatively short period of time, power-on reset signal POR can be maintained at H level during a period long enough for surely resetting potentials IA1–IAn.

Note that, if the potentials IA1–IAn are all equal to respective reset potentials from the beginning, each potential is reset without mistake even if reset signal RST attains an inactive state after a relatively short period of time.

Fourth Embodiment

Figure 25:
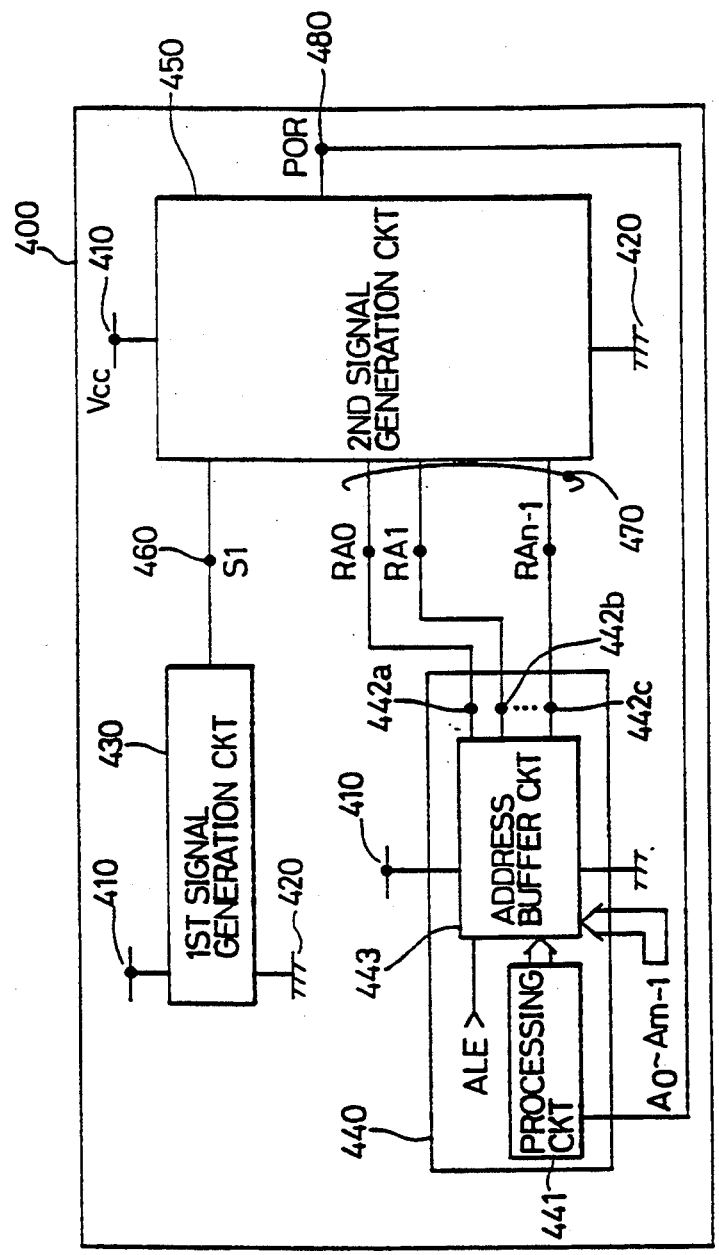
FIG. 25 is a block diagram showing a semiconductor integrated circuit device according to a fourth embodiment of the invention.

Referring to FIG. 25, a semiconductor integrated circuit device 400 according to a fourth embodiment of the invention includes a first signal generation circuit 430 for outputting a first signal S1, an internal circuit 440 for processing an applied signal for output, and a second signal generation circuit 450. Second signal generation circuit 450 has a first input node 460, second input nodes 470 having a plurality of inputs, and an output node 480. Second signal generation circuit 450 outputs a power-on reset signal to output node 480 in response to the inputs of input node 460 and second input node 470. Power-on reset signal POR appearing at output node 480 is applied to internal circuit 440. The plurality of inputs of second input nodes 470 are all connected to internal circuit 440. First input node 460 is connected to first signal generation circuit 430. Circuits 430, 440, and 450 are all connected to power supply potential 410 and ground potential 420 and powered by power supply potential Vcc.

Internal circuit 440 includes a processing circuit 441 having an output node which should be set to a reset potential upon receiving power-on reset signal POR, and an address buffer circuit 443 operating in response to a signal from the output node of processing circuit 441, m-bit external address signals A0 to Am-1 and an address latch enable signal ALE. Internal circuit 440 converts m-bit external address signals A0 to Am-1 into n internal address signals for output to n output nodes 442a–442c (n: integer). Output nodes 442a–442c are connected to n inputs of second input nodes 470 of second signal generation circuit 450, respectively. Note that the potentials of output nodes 442a–442c are represented as RA0 to RAn-1. Address buffer circuit 443 is the one used in a usual RAM.

Figure 26:
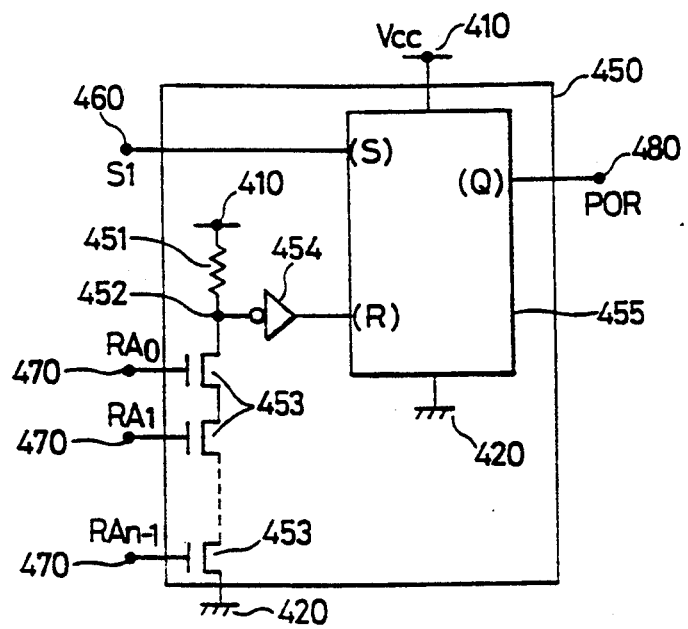
FIG. 26 is a circuit diagram showing a second signal generation circuit according to the fourth embodiment of the invention.

Referring to FIG. 26, second signal generation circuit 450 includes a resistor 451 connected between power supply potential node 410 and first node 452 and having a high resistance value, a plurality (n) of n-channel MOS transistors 453 connected in series between first node 452 and ground potential node 420, an inverter 454 having an input connected to first node 450, and an R-S flipflop circuit 455 having its set input (S) connected to first input node 460, its reset input (R) to the output of inverter 454, and its output (Q) to output node. R-S flipflop circuit 455 is connected between power supply potential node 410 and ground potential node 420 and powered from power supply potential node 410.

The gates of the plurality (n) of n-channel MOS transistors 453 are connected to second input nodes 470, respectively, and supplied with outputs RA0 to RAn-1 from address buffer circuit 443.

Referring back to FIG. 25, address buffer circuit 443 converts external address signals A0 to Am-1 into n internal address signals and outputs the same to output nodes 442a–442c, if address latch enable signal ALE is at H level. If address latch enable signal ALE is at L level, address buffer circuit 443 outputs H level to all the output nodes 442a–442c and enters a stand-by state in response to the potential of output node of processing circuit 441 being set to the reset potential. Although the potential of output node of processing circuit 441 is in an indefinite state during the rising of power supply potential Vcc, it brings its output node to a reset potential upon receiving power-on reset signal POR.

The overall function of second signal generation circuit 450 is as follows. Second signal generation circuit 450 outputs to output node 480 power-on reset signal POR which changes as in the following. Power-on reset signal POR rises as first signal S1 rises from L level to H level. After potentials RA0 to RAn-1 input to second input nodes 470 all attain H level, the power-on reset signal falls to L level. Therefore, power-on reset signal POR maintains H level until the output node of processing circuit 441 is reset for sure, and can surely reset the output node of processing circuit 441.

Figure 27:
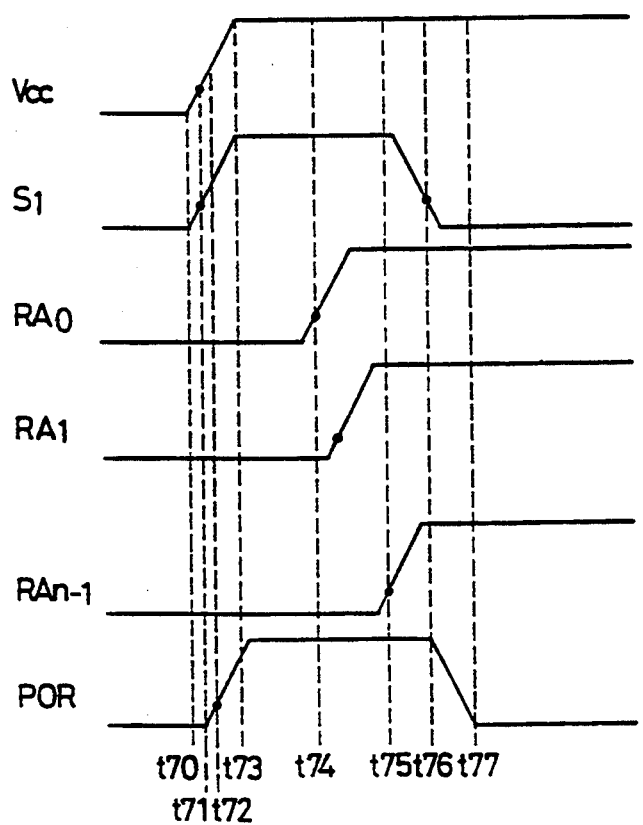
FIGS. 27 and 28 are timing charts for use in illustration of the operation of the semiconductor integrated circuit according to the fourth embodiment of the invention.
Figure 28:
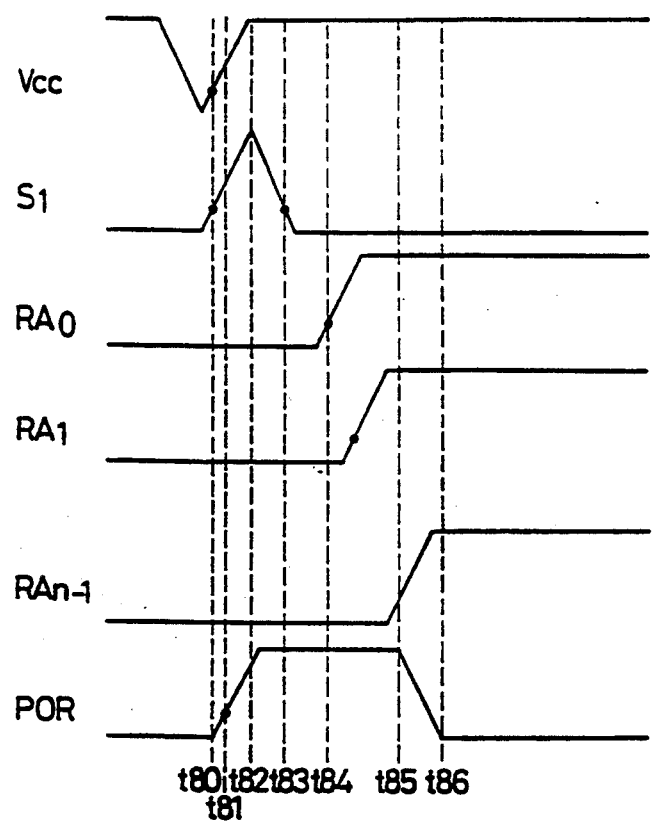

Referring to FIGS. 27 and 28, semiconductor integrated circuit device 400 according to the fourth embodiment operates as follows. Referring to FIG. 27, if an activation period for first signal S1 output by first signal generation circuit 430 (the period in which H level potential is reached in this embodiment) is long enough, semiconductor integrated circuit device 400 operates as follows.

Referring to FIG. 27(a), the potential Vcc of power supply potential node 410 starts rising from the ground potential at time $t_{70}$, exceeds the prescribed threshold voltage to reach H level potential at time $t_{71}$, and reaches prescribed 5 V at time $t_{73}$. Thereafter, potential Vcc is maintained at 5 V.

Referring to FIG. 27(b), in response to the rising of potential Vcc, first potential S1 starts rising at time $t_{70}$, and reaches H level at the time $t_{71}$. First signal S1 is maintained at H level for a relatively long period of time, and then falls to L level at time $t_{76}$.

In response to first signal S1 attaining H level, R-S flipflop circuit 455 raises the potential of its output (Q) to H level. More specifically, as illustrated in FIG. 27(f), power-on reset signal POR rises to H level at time $t_{72}$.

At this point, the potentials RA0 to RAn-1 of output nodes 442a–442c of address buffer circuit 443 which are input to second input node 470 shown in FIGS. 25 and 26 are at L level as illustrated in FIGS. 27(c)–(e). The potentials of output nodes of processing circuits 441 shown in FIG. 25 are respectively set to reset potentials in response to power-on reset signal POR rising to H level.

Referring to FIGS. 27(c)–(e), in response to the output nodes of processing circuit 441 being respectively reset to reset potentials, potentials RA0 to RAn-1 attain H level during the period $t_{74}$–$t_{75}$, and address buffer circuit 443 enters a stand-by state.

Referring to FIG. 26, if all the potentials RA0 to RAn-1 are at H level, current flows from power supply potential node 410 to ground potential node 420, and the potential of first node 452 is brought to the ground potential. Thus, the potential of reset input (R) R-S flipflop circuit 455 attains H level.

After time $t_{75}$ at time $t_{76}$, first signal S1 falls to L level as described above. Thus, after time $t_{76}$, the potential of set input (S) of R-S flipflop circuit 455 in FIG. 26 is at L level, the potential of reset input (R) is at H level, and the potential of output (Q) is at L level, respectively.

More specifically, referring to FIG. 27(f), in response to first signal S1 falling to L level potential at time $t_{76}$, power-on reset signal POR also starts falling, and reaches the substantially ground potential at time $t_{77}$.

As described above, if first signal S1 is in an active state for a sufficiently long period of time, first signal S1 falls after all the potentials RA0 to RAn-1 are brought to reset potentials. Power-on reset signal POR maintains H level until first signal S1 falls to L level. Accordingly, resetting the output nodes of processing circuit 441 can surely be performed.

Now, referring to FIG. 28, the semiconductor integrated circuit device 400 operates as follows when power supply potential Vcc falls to L level and remains there in a very short period of time due to instantaneous power failure.

Referring to FIG. 28(a), assume that power supply potential Vcc falls to L level for a very short period of time and then rises at time $t_{80}$ to reach H level potential exceeding the prescribed threshold voltage. Power supply potential Vcc reaches prescribed 5 V at time $t_{82}$.

Referring to FIG. 28(b), first signal S1 rises to H level at time $t_{80}$ in response to power supply potential Vcc rising to H level potential. First signal S1 falls once again to L level potential at time $t_{83}$ after a relatively short activation period.

When first signal S1 rises to H level, referring to FIG. 26, the potential of set input (S) of R-S flipflop circuit 455 is at H level, and the potential of reset input (R) is indefinite (although it is likely to be at H level). R-S flipflop circuit 455 is of a set preferential type, and therefore outputs an H level signal to its output (Q) regardless of the potential of reset input (R). More specifically, as illustrated in FIG. 28(f), power reset signal POR starts rising at time $t_{80}$ and attains H level potential at time $t_{81}$.

In this case, the time $t_{83}$ at which first signal S1 once again falls to L level is before potentials RA0 to RAn-1 are reset to reset potentials. In this case, however, in the semiconductor integrated circuit device according to the fourth embodiment, since power-on reset signal POR does not immediately fall to the ground potential, potentials RA0 to RA0n-1 are surely reset as in the following manner.

Suppose that first signal S1 falls to L level at time $t_{83}$. Referring to FIG. 26, the potential of set input (S) of R-S flipflop circuit 455 is at L level. If all the transistors 453 conduct, the potential of one reset input (R) is at H level and if any of transistors 453 is in a non-conductive state, the potential is at L level.

Assume that at least one of potentials RA0 to RAn-1 is reset. More specifically voltage applied to at least one gate of transistors 453 is at L level. In such a case, the transistor is in a non-conductive state. Accordingly, the potential of first node 452 is at H level, and the potential of reset input (R) of R-S flipflop circuit 455 is at L level. R-S flipflop circuit 455 continues to output a signal of the current output level. Accordingly, the potential of output (Q) is at H level, and the potential of power-on reset signal POR is maintained at H level. The H level of power-on reset signal POR is maintained until all the potentials RA0 to RAn-1 are reset. Therefore, referring to FIGS. 28(c)–(e), if potentials RA0 to RAn-1 are reset during the period $t_{84} - t_{85}$, power-on reset signal POR does not fall until the time $t_{85}$ at which the last of potentials is reset (see FIG. 28(f)). Then, the signal falls to the substantially ground potential at time $t_{86}$.

More specifically, even if the period during which first signal S1 is in an active state is short as shown in FIG. 28, power-on reset signal POR maintains H level until all the potentials RA0 to RAn-1 are reset. Power-on reset signal POR does not fall to the ground potential until all the potentials RA0 to RAn-1 attain H level and address buffer circuit 443 enters a stand-by state. Consequently, the output node of the processing circuit can surely be reset.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
    an internal circuit connected between a first potential and a second potential and having a first output node with a potential which becomes indefinite immediately after a potential difference between said first potential and said second potential becomes equal to or larger than a prescribed value, and an input for receiving a power-on reset signal, and having a function of forcing the potential of said first output node to a prescribed first level in response to said power-on reset signal being applied longer than a prescribed time period; and
    power-on reset signal generation means having a first input to which a first signal is input, said first signal including a reset signal for setting said power-on reset signal generation means, a second input directly connected to said first output node of said internal circuit, and an output directly connected to said input of said internal circuit for transmitting the power-on reset signal to said internal circuit, for initiating generation of said power-on reset signal in response to the first signal setting said power-on reset signal generation means, and for stopping generation of said power-on reset signal in response to the potential of said first output node of said internal circuit attaining said prescribed first level.

2. A semiconductor integrated circuit device as recited in claim 1, further comprising first signal generation means to be connected between said first potential and said second potential and responsive to the potential difference between said first potential and second potential exceeding the predetermined value for generating said first signal for a relatively short period of time for application to said input for power-on reset signal.

3. A semiconductor integrated circuit device as recited in claim 1, further comprising a terminal for externally receiving said first signal.

4. A semiconductor integrated circuit device as recited in claim 1, wherein
    said power-on reset signal generation means includes reset signal input storing means for storing a prescribed first value in response to the initiation of input of said first signal, and a prescribed second value different from said first value, in response to the potential of said first output node changing to said first level from a second level different from said first level, and changing the potential of said output of said power-on reset signal generation means based on the stored values, thereby outputting said power-on reset signal.

5. A semiconductor integrated circuit device as recited in claim 4, wherein said reset signal input storing means includes flipflop circuit means to be set in response to the initiation of input of said first signal, and to be reset in response to the potential of said first output node changing to said first level from the second level different from said first level.

6. A semiconductor integrated circuit device as recited in claim 5, wherein
    said first level is a high level,
    said second level is a low level; and
    said flipflop circuit means includes an R-S flipflop circuit connected to receive said first signal at its set input, and having its reset input connected to said first output node.

7. A semiconductor integrated circuit device, comprising:
    an internal circuit connected between a first potential and a second potential and having a first output node whose potential becomes indefinite immediately after the potential difference between said first potential and said second potential becomes equal to or larger than a prescribed value, and an input for a power-on reset signal, and having a function of forcing the potential of said first output node to a prescribed first level in response to said power-on reset signal being applied longer than a prescribed time period; and
    power-on reset signal generation means having a first input to which a first signal is input, a second input connected to said first output node, and an output connected to said input for the power-on reset signal in said internal circuit, for initiating generation of said power-on reset signal in response to the first signal being input, and stopping generation of said power-on reset signal in response to the potential of said first output node attaining said first level,
    Wherein said power-on reset signal generation means includes reset signal input storing means for storing a prescribed first value in response to the initiation of input of said first signal, and a prescribed second value different from said first value, in response to the potential of said first output node changing to said first level from a second level different from said first level, and changing the potential of said output of said power-on reset signal generation means based on the stored values, thereby outputting said power-on reset signal, wherein said reset signal input storing means includes flipflop circuit means to be set in response to the initiation of input of said first signal, and to be reset in response to the potential of said first output node changing to said first level from the second level different from said first level, wherein said first level is a low level, said second level is a high level, said flipflop circuit means includes inversion means having its input connected to said first output node for inverting the potential of its input, and an R-S flipflop circuit connected to receive said first signal at its set input and having its reset input connected to the output of said inversion means.

8. A semiconductor integrated circuit device comprising:

an internal circuit connected between a first potential and a second potential and having a first output node whose potential becomes indefinite immediately after the potential difference between said first potential and said second potential becomes equal to or larger than a prescribed value, and an input for a power-on reset signal, and having a function of forcing the potential of said first output node to a prescribed first level in response to said power-on reset signal being applied longer than a prescribed time period; and power-on reset signal generation means having a first input to which a first signal is input, a second input connected to said first output node, and an output connected to said input for the power-on reset signal in said internal circuit, for initiating generation of said power-on reset signal in response to the first signal being input, and stopping generation of said power-on reset signal in response to the potential of said first output node attaining said first level, wherein said internal circuit has a plurality of said first output nodes, and said power-on reset signal generation means includes, detection means for detecting all said plurality of first output nodes attaining said first level and for generating detection signal, and reset signal input storing means for storing a prescribed first value in response to the initiation of input of said first signal, and a prescribed second value different from said first value in response to said detection signal, and changing the potential of said output of said power-on reset signal generation means based on the stored values, thereby outputting said power-on reset signal.

9. A semiconductor integrated circuit device as recited in claim 8, wherein said first level is a high level, and said detection means includes logic circuit means having a plurality of inputs connected to said plurality of first output nodes, respectively for detecting all the potentials at the inputs attaining the high level and for generating a detection signal.

10. A semiconductor integrated circuit device as recited in claim 9, wherein said logic circuit means includes, a plurality of switching means connected in series between said first potential and said second potential, provided corresponding to said plurality of first output nodes and controlled by the potentials of corresponding said first output nodes, means connected in series to said plurality of switching means between said first potential and said second potential for generating a prescribed potential difference between the opposite ends, when said plurality of switching means are all in a conductive state, and inversion means having an input connected to a connecting point between said plurality of switching means or between said switching means and said means for generating the potential difference.

11. A semiconductor integrated circuit device as recited in claim 9, wherein said logic circuit means includes an AND gate circuit having a plurality of inputs corresponding to said plurality of first output nodes for generating a high level signal when all the inputs are at high level.

12. A semiconductor integrated circuit device, comprising:

an internal circuit connected between a first potential and a second potential and having a first output node whose potential becomes indefinite immediately after the potential difference between said first potential and said second potential becomes equal to or larger than a prescribed value, and an input for a power-on reset signal, and having a function of forcing the potential of said first output node to a prescribed first level in response to said power-on reset signal being applied longer than a prescribed time period; and power-on reset signal generation means having a first input to which a first signal is input, a second input connected to said first output node, and an output connected to said input for the power-on reset signal in said internal circuit, for initiating generation of said power-on reset signal in response to the first signal being input, and stopping generation of said power-on reset signal in response to the potential of said first output node attaining said first level, wherein said internal circuit has in addition to said first output node a second output node whose potential difference between said first potential and said second potential becomes equal to or higher than the prescribed value, and a function of forcing the potential of said second output node a second level different from said first level, in response to said power-on reset signal being applied longer than a prescribed time period, and said power-on reset signal generation means includes, detection means for detecting the potential of said first output node attaining said first level and the potential of said second output node attaining said second level and for generating a detection signal, and reset signal input storing means for storing a prescribed first value in response to the initiation of input of said first signal, and a prescribed second value different from said first value in response to said detection signal, and changing the potential of said output of said power-on reset signal generation means based on the stored values, thereby outputting said power-on reset signal.

13. A semiconductor integrated circuit device as recited in claim 12, wherein said first level is a high level, said second level is a low level, and said detection means includes logic circuit means having a first input connected to said first output node and a second input connected to said second output node, for detecting potentials at said first and second inputs being the high level and the low level, respectively, and generating a detection signal.

14. A semiconductor integrated circuit device as recited in claim 13, wherein said logic circuit means includes, inversion means having an input connected to said second output node for inverting the level of its input and outputting the same, and an AND gate circuit having a plurality of inputs corresponding to said first output node and said inversion means, for generating a high level signal, when all the inputs are at the high level.

15. A semiconductor integrated circuit device, comprising:

an internal circuit connected to first and second potentials and including an internal output node, the internal output node having an internal output potential which is substantially unaffected immediately after a prescribed potential difference is less than a potential difference between the first and second potentials; and an internal input node receiving a power-on reset signal which forces the internal output potential of said internal output node to a prescribed potential when the power-on reset signal is applied for longer than a prescribed time period; and an R-S flip-flop connected to said internal circuit having a set input receiving a reset signal for setting said R-S flip flop;

a reset input directly connected to said internal output node of said internal circuit; and an output directly connected to said internal input node of said internal circuit, wherein said R-S flip-flop transmits the power-on reset signal from said output to said internal input node when said set input receives the reset signal, and wherein said R-S flip-flop ceases transmission of the power-on reset signal from said output to said internal input node when said internal output node reaches the prescribed potential.

16. A semiconductor integrated circuit device as recited in claim 15, wherein the first potential has first values between a first high and a first low potential, wherein the power-on reset signal has second values between a second high and a second low potential, wherein when the first potential transitions from the high potential to the low potential, said R-S flip-flop continues to transmit the power-on reset signal at the second high potential until said set input of said R-S flip-flop receives the reset signal which drives the power-on reset signal from the second high potential to the second low potential.

* * * * *